United States Patent
Ensher et al.

(10) Patent No.: US 8,311,067 B2
(45) Date of Patent: Nov. 13, 2012

(54) SYSTEM AND DEVICES FOR IMPROVING EXTERNAL CAVITY DIODE LASERS USING WAVELENGTH AND MODE SENSORS AND COMPACT OPTICAL PATHS

(75) Inventors: Jason R. Ensher, Lafayette, CO (US); Paul C. Smith, Louisville, CO (US); Ian B. Murray, Erie, CO (US)

(73) Assignee: Akonia Holographics, LLC, Katonah, NY (US)

( * ) Notice: Subject to any disclaimer, the term of this patent is extended or adjusted under 35 U.S.C. 154(b) by 280 days.

(21) Appl. No.: 12/457,498

(22) Filed: Jun. 12, 2009

(65) Prior Publication Data
US 2009/0323737 A1 Dec. 31, 2009

Related U.S. Application Data

(60) Provisional application No. 61/060,890, filed on Jun. 12, 2008.

(51) Int. Cl.
*H01S 3/10* (2006.01)
(52) U.S. Cl. .............. 372/20; 372/99; 372/102
(58) Field of Classification Search ............... 372/20
See application file for complete search history.

(56) References Cited

U.S. PATENT DOCUMENTS

| | | | |
|---|---|---|---|
| 4,384,203 A * | 5/1983 | Wells | 250/227.21 |
| 6,103,454 A | 8/2000 | Dhar et al. | |
| 6,482,551 B1 | 11/2002 | Dhar et al. | |
| 6,650,447 B2 | 11/2003 | Curtis et al. | |
| 6,743,552 B2 | 6/2004 | Setthachayanon et al. | |
| 6,765,061 B2 | 7/2004 | Dhar et al. | |
| 6,780,546 B2 | 8/2004 | Trentler et al. | |
| 7,397,571 B2 | 7/2008 | Krneta et al. | |
| 7,495,838 B2 | 2/2009 | Krneta et al. | |
| 7,521,154 B2 | 4/2009 | Trentler | |
| 2002/0092340 A1 * | 7/2002 | Prater et al. | 73/24.02 |
| 2003/0206320 A1 | 11/2003 | Cole et al. | |
| 2006/0274798 A1 * | 12/2006 | Pritchett et al. | 372/38.01 |
| 2007/0223554 A1 * | 9/2007 | Hunter et al. | 372/102 |

OTHER PUBLICATIONS

McLeod, et al., "Micro-Holographic Multi-Layer Optical Disk Data Storage," Interntional Symposium on Optical Memory and Optical Data Storage, Jul. 2005.
Psaltis, et al., "Holographic Memories," Scientific American, Nov. 1995.
Tanaka, et al., "Littrow-Type External-Cavity Blue Laser for Holographic Data Storage," Applied Optics, vol. 46, pp. 3583-3592, Jun. 10, 2007.
Hawthorn, et al., Littrow Configuration Tunable External Cavity Diode Laser with Fixed Direction Output Beam, Rev. of Scientific Instr., vol. 72, p. 4477, (2001) (Abstract).

* cited by examiner

*Primary Examiner* — Patrick Stafford
*Assistant Examiner* — Xinning Niu
(74) *Attorney, Agent, or Firm* — Morrison & Foerster LLP

(57) ABSTRACT

External cavity laser (ECL) systems and methods for measuring the wavelength of the ECL by using a portion of the positional light received by the position sensitive detector (PSD) to determine the position of a wavelength tuning element (such as a diffraction grating or an etalon), for determining the longitudinal laser mode or power output of the laser from a portion of the laser light received by a beam-shearing mode sensor, and by using a non-output beam(s) from a transmissive diffraction grating in the ECL to monitor the external cavity laser.

24 Claims, 17 Drawing Sheets

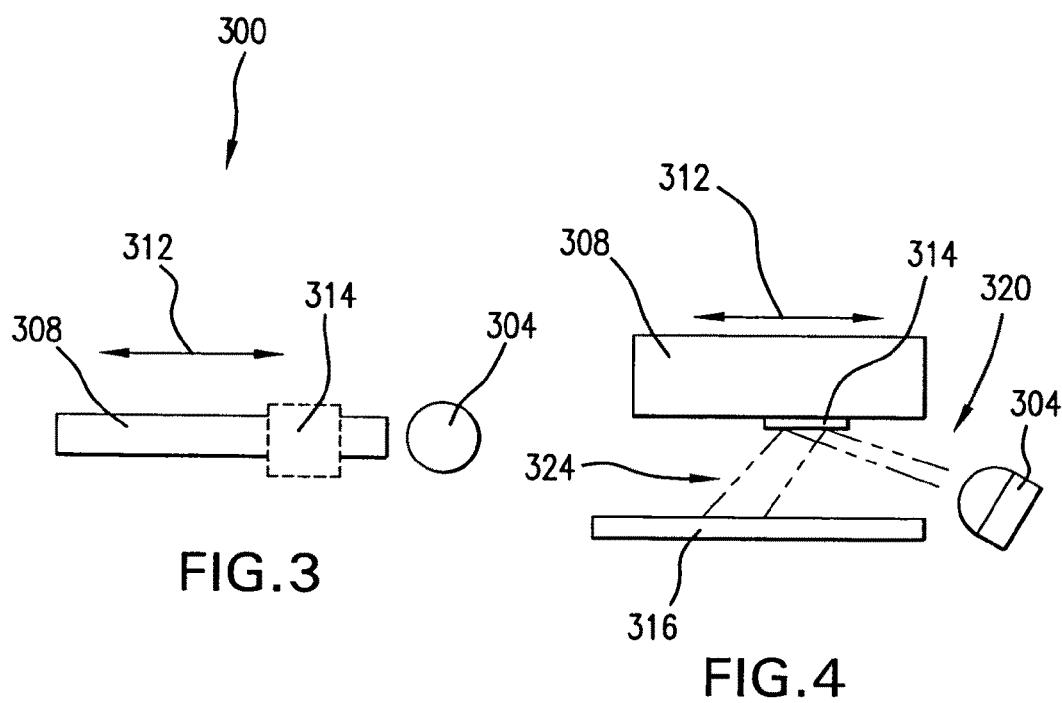

SYSTEM AND DEVICES FOR IMPROVING EXTERNAL CAVITY DIODE LASERS USING WAVELENGTH AND MODE SENSORS AND COMPACT OPTICAL PATHS

CROSS-REFERENCE TO RELATED APPLICATIONS

This application makes reference to and claims the benefit of the following co-pending U.S. Provisional Patent Application No. 61/060,890 filed Jun. 12, 2008. The entire disclosure and contents of the foregoing Provisional Application is hereby incorporated by reference. This application also makes reference to the following U.S. patent applications: U.S. patent application Ser. No. 12/351,047 entitled "USE OF FEEDBACK ERROR AND/OR FEED-FORWARD SIGNALS TO ADJUST CONTROL AXES TO OPTIMAL RECOVERY POSITION OF HOLOGRAM IN HOLOGRAPHIC DATA STORAGE SYSTEM OR DEVICE" filed Jan. 9, 2009; U.S. patent application Ser. No. 12/266,637 entitled "REPLACEMENT AND ALIGNMENT OF LASER" filed Nov. 7, 2008, which is a division of U.S. patent application Ser. No. 11/440,368, filed May 25, 2006; U.S. Provisional Patent Application No. 61/098,445 entitled "METHOD FOR FINDING AND TRACKING SINGLE MODE OPERATION POINT OF AN EXTERNAL CAVITY DIODE LASER" filed Sep. 19, 2008; U.S. Provisional Patent Application No. 61/028,628 entitled "SERVO FOR HOLOGRAPHIC DATA STORAGE" filed Feb. 14, 2008; U.S. Provisional Patent Application No. 60/980,604 entitled "LAYOUT METHOD FOR MULTIPLEXED HOLOGRAMS" filed Oct. 17, 2007; U.S. patent application Ser. No. 12/210,476, entitled "LAYOUT METHOD FOR MULTIPLEXED HOLOGRAMS" filed Sep. 15, 2008; U.S. Provisional Patent Application No. 61/083,254 entitled "METHOD ALLOWING LOCALIZED GATING OF DIFFUSION PROPERTIES," filed Jul. 24, 2008; U.S. Provisional Patent Application No. 61/082,328 entitled "METHOD TO MODIFY AND APPLY EDGE SEAL MATERIALS TO LAMINATED MEDIA SO THAT THE RESULTING SEAL HAS MINIMAL EFFECT ON THE SHAPE OF THE MEDIA AFTER EXPOSURE TO ELEVATED TEMPERATURES," filed Jul. 21, 2008; U.S. Provisional Patent Application No. 61/054,613 entitled "METHOD FOR COMPENSATING FOR THERMAL EFFECTS OF A PHOTOPOLYMER BY USING ADAPTIVE ENERGY CONTROL," filed May 20, 2008; U.S. Provisional Patent Application No. 60/980,604 entitled "LAYOUT METHOD FOR MULTIPLEXED HOLOGRAMS" filed Oct. 17, 2007; U.S. Provisional Patent Application No. 60/855,754 entitled "EMULATION OF DISSIMILAR REMOVABLE MEDIUM STORAGE DEVICE TYPES ASSISTED BY INFORMATION EMBEDDED IN THE LOGICAL FORMAT," filed Sep. 1, 2006; U.S. patent application Ser. No. 11/849,658 entitled "EMULATION OF DISSIMILAR REMOVABLE MEDIUM STORAGE DEVICE TYPES ASSISTED BY INFORMATION EMBEDDED IN THE LOGICAL FORMAT," filed Sep. 4, 2007; U.S. Provisional Patent Application No. 60/831,692 entitled "EXTERNAL CAVITY DIODE LASER COLLIMATION GROUP ADJUSTMENT" filed Jul. 19, 2006; U.S. patent application Ser. No. 11/826,517 entitled "COLLIMATION LENS GROUP ADJUSTMENT FOR LASER SYSTEM" filed Jul. 16, 2007, now U.S. Pat. No. 7,495,838, issued Feb. 24, 2009; U.S. Provisional Patent Application No. 60/802,530 entitled "HIGH-SPEED ELECTROMECHANICAL SHUTTER" filed May 25, 2006; U.S. patent application Ser. No. 11/752,804 entitled "HIGH-SPEED ELECTROMECHANICAL SHUTTER" filed May 25, 2007; U.S. Provisional Patent Application No. 60/793,322, entitled "METHOD FOR DESIGNING INDEX CONTRASTING MONOMERS" filed Apr. 20, 2006; U.S. Provisional patent application Ser. No. 11/738,394 entitled "INDEX CONTRASTING-PHOTOACTIVE POLYMERIZABLE MATERIALS, AND ARTICLES AND METHODS USING SAME" filed Apr. 20, 2007; U.S. Provisional Patent Application No. 60/780,354 entitled "EXTERNAL CAVITY LASER" filed Mar. 9, 2006; U.S. patent application Ser. No. 11/716,002, entitled "EXTERNAL CAVITY LASER" filed Mar. 9, 2007; U.S. Provisional Patent Application No. 60/779,444 entitled "METHOD FOR DETERMINING MEDIA ORIENTATION AND REQUIRED TEMPERATURE COMPENSATION IN PAGE-BASED HOLOGRAPHIC DATA STORAGE SYSTEMS USING DATA PAGE BRAGG DETUNING MEASUREMENTS" filed Mar. 7, 2006; U.S. patent application Ser. No. 11/714,125 entitled "METHOD FOR DETERMINING MEDIA ORIENTATION AND REQUIRED TEMPERATURE COMPENSATION IN PAGE-BASED HOLOGRAPHIC DATA STORAGE SYSTEMS USING DATA PAGE BRAGG DETUNING MEASUREMENTS" filed Mar. 6, 2007; U.S. Provisional Patent Application No. 60/778,935 entitled "MINIATURE FLEXURE BASED SCANNERS FOR ANGLE MULTIPLEXING" filed Mar. 6, 2006; U.S. Provisional Patent Application No. 60/780,848 entitled "MINIATURE FLEXURE BASED SCANNERS FOR ANGLE MULTIPLEXING" filed Mar. 10, 2006; U.S. Provisional Patent Application No. 60/756,556 entitled "EXTERNAL CAVITY LASER WITH A TUNABLE HOLOGRAPHIC ELEMENT" filed Jan. 6, 2006; U.S. patent application Ser. No. 11/649,801 entitled "An EXTERNAL CAVITY LASER WITH A TUNABLE HOLOGRAPHIC ELEMENT" filed Jan. 5, 2007; U.S. Provisional Patent Application No. 60/738,597 entitled "METHOD FOR HOLOGRAPHIC DATA RETRIEVAL BY QUADRATURE HOMODYNE DETECTION" filed Nov. 22, 2005; U.S. patent application Ser. No. 11/562,533 entitled "METHOD FOR HOLOGRAPHIC DATA RETRIEVAL BY QUADRATURE HOMODYNE DETECTION" filed Nov. 22, 2006; U.S. patent application Ser. No. 11/402,837 entitled "ARTICLE COMPRISING HOLOGRAPHIC MEDIUM BETWEEN SUBSTRATES HAVING ENVIRONMENTAL BARRIER SEAL AND PROCESS FOR PREPARING SAM" filed Dec. 2, 2005; U.S. patent application Ser. No. 11/291,845 entitled "ARTICLE COMPRISING HOLOGRAPHIC MEDIUM BETWEEN SUBSTRATES HAVING ENVIRONMENTAL BARRIER SEAL AND PROCESS FOR PREPARING SAM" filed Dec. 2, 2005, now U.S. Pat. No. 7,173,744, issued Feb. 6, 2007; U.S. Provisional Patent Application No. 60/728,768 entitled "METHOD AND SYSTEM FOR INCREASING HOLOGRAPHIC DATA STORAGE CAPACITY USING IRRADIANCE-TAILORING ELEMENT" filed Oct. 21, 2005; U.S. patent application Ser. No. 11/319,425 entitled "METHOD AND SYSTEM FOR INCREASING HOLOGRAPHIC DATA STORAGE CAPACITY USING IRRADIANCE-TAILORING ELEMENT" filed Dec. 27, 2005; U.S. Provisional Application No. 60/684,531 entitled "METHODS FOR MAKING A HOLOGRAPHIC STORAGE DRIVE SMALLER, CHEAPER, MORE ROBUST AND WITH IMPROVED PERFORMANCE" filed May 26, 2005; U.S. patent application Ser. No. 11/440,368 entitled "REPLACEMENT AND ALIGNMENT OF LASER" filed May 25, 2006, now U.S. Pat. No. 7,466,411, issued Dec. 16, 2008; U.S. patent application Ser. No. 11/440,369 entitled "HOLOGRAPHIC DRIVE HEAD ALIGNMENTS" filed May 25, 2006; U.S. patent application Ser. No. 11/440,365 entitled "LASER MODE STABILIZATION USING AN ETALON" filed May 25, 2006; U.S. patent application Ser. No. 11/440,366 entitled "ERASING HOLOGRAPHIC MEDIA" filed May 25, 2006; U.S. patent application Ser. No. 11/440,367 entitled "POST-CURING OF HOLOGRAPHIC MEDIA" filed May 25, 2006; U.S. patent application Ser. No. 11/440,371 entitled "SENSING ANGULAR ORIENTATION OF HOLOGRAPHIC MEDIA IN A HOLOGRAPHIC MEMORY SYSTEM" filed May 25, 2006; U.S. patent application Ser. No. 11/440,372 entitled "SENSING ABSOLUTE POSITION OF AN ENCODED OBJECT" filed May 25, 2006; U.S. patent application Ser. No. 11/440,357 entitled "CONTROLLING THE TRANSMISSION AMPLITUDE PROFILE OF A COHERENT LIGHT BEAM IN A HOLOGRAPHIC MEMORY SYSTEM" filed May 25, 2006; U.S. patent application Ser. No. 11/440,358 entitled "OPTICAL DELAY LINE IN HOLOGRAPHIC DRIVE" filed May 25, 2006; U.S. patent application Ser. No. 11/440,359 entitled "HOLOGRAPHIC DRIVE HEAD AND COMPONENT ALIGNMENT" filed May 25, 2006; U.S. patent application Ser. No. 11/440,448 entitled "IMPROVED OPERATIONAL MODE PERFORMANCE OF A HOLOGRAPHIC MEMORY SYSTEM" filed May 25, 2006, now U.S. Pat. No. 7,480,085, issued Jan. 20, 2009; U.S. patent application Ser. No. 11/440,447 entitled "PHASE CONJUGATE RECONSTRUCTION OF A HOLOGRAM" filed May 25, 2006; U.S. patent application Ser. No. 11/440,446 entitled "METHODS AND SYSTEMS FOR LASER MODE STABILIZATION" filed May 25, 2006, now U.S. Pat. No. 7,397,571, issued Jul. 8, 2008; U.S. patent application Ser. No. 11/440,370 entitled "ILLUMINATIVE TREATMENT OF HOLOGRAPHIC MEDIA" filed May 25, 2006; U.S. patent application Ser. No. 11/447,033 entitled "LOADING AND UNLOADING MECHANISM FOR DATA STORAGE CARTRIDGE AND DATA DRIVE" filed Jun. 6, 2006; U.S. patent application Ser. No. 11/283,864 entitled "DATA STORAGE CARTRIDGE LOADING AND UNLOADING MECHANISM, DRIVE DOOR MECHANISM AND DATA DRIVE" filed Nov. 22, 2006; U.S. patent application Ser. No. 11/237,883 entitled "HOLOGRAPHIC RECORDING MEDIUM AND SUBSTRATE WITH CTE COMPENSATING INTERFACE THEREBETWEEN" filed Sep. 29, 2005; U.S. patent application Ser. No. 11/261,840 entitled "SHORT STACK RECORDING IN HOLOGRAPHIC MEMORY SYSTEMS" filed Dec. 2, 2005; U.S. patent application Ser. No. 11/067,010 entitled "HIGH FIDELITY HOLOGRAM DEVELOPMENT VIA CONTROLLED POLYMERIZATION" filed Feb. 28, 2005; U.S. Provisional Patent Application No. 60/576,381 entitled "METHOD FOR ORGANIZING AND PROTECTING DATA STORED ON HOLOGRAPHIC MEDIA BY USING ERROR CONTROL AND CORRECTION TECHNIQUES AND NEW DATA ORGANIZATION STRUCTURES" filed Jun. 3, 2004; U.S. patent application Ser. No. 11/139,806 entitled "DATA PROTECTION SYSTEM" filed May 31, 2005; U.S. patent application Ser. No. 11/140,151 entitled "MULTI-LEVEL FORMAT FOR INFORMATION STORAGE" filed May 31, 2005; and U.S. patent application Ser. No. 10/866,823 entitled "THERMOPLASTIC HOLOGRAPHIC MEDIA" filed Jun. 15, 2004. The entire disclosure and contents of the foregoing U.S. patent applications are hereby incorporated by reference.

FIELD OF THE INVENTION

The present invention broadly relates generally to laser systems and methods for measuring the wavelength of the laser, for determining the longitudinal laser mode or power output of the laser, and for using a non-output beam(s) from a transmissive diffraction grating in monitoring an external cavity laser.

BACKGROUND

Developers of information storage devices continue to seek increased storage capacity. As part of this development, holographic memory systems have been suggested as alternatives to conventional memory devices. Holographic memory systems may be designed to record data one bit of information (i.e., bit-wise data storage). See McLeod et al. "Micro-Holographic Multi-Layer Optical Disk Data Storage," *International Symposium on Optical Memory and Optical Data Storage* (July 2005). Holographic memory systems may also be designed to record an array of data that may be a 1-dimensional linear array (i.e., a 1×N array, where N is the number linear data bits), or a 2-dimension array commonly referred to as a "page-wise" memory systems. Page-wise memory systems may involve the storage and readout of an entire two-dimensional representation, e.g., a page of data. Typically, recording light passes through a two-dimensional array of dark and transparent areas representing data, and the system stores, in three dimensions, the pages of data holographically as patterns of varying refractive index imprinted into a storage medium. See Psaltis et al., "Holographic Memories," *Scientific American*, November 1995, where holographic systems are discussed generally, including page-wise memory systems.

In a holographic data storage system, information is recorded by making changes to the physical (e.g., optical) and chemical characteristics of the holographic storage medium. These changes in the holographic storage medium take place in response to the local intensity of the recording light. That intensity is modulated by the interference between a data-bearing beam (the data beam) and a non-data-bearing beam (the reference beam). The pattern created by the interference of the data beam and the reference beam forms a hologram which may then be recorded or written in the holographic storage medium. If the data-bearing beam is encoded by passing the data beam through, for example, a spatial light modulator (SLM), the hologram(s) may be recorded or written in the holographic storage medium as holographic data.

External cavity laser diodes (ECLDs) are useful light sources for applications in spectroscopy, telecommunications and holography. Holographic data storage also illustrates an application with three requirements that an ECLD meets: wide wavelength tuning range, operation in a single-longitudinal mode, and output powers in the tens of milliwatts. In some holographic data storage approaches, the operating wavelength range may be in the range of from about 402 to about 408 nm. Because holograms are created by interference, single-longitudinal mode operation may be necessary to form holograms having a high signal-to-noise ratio. Finally, the strength of the created holograms, which are stored in a holographic storage medium, depends upon the number of photons delivered to the storage medium. (The number of photons absorbed by the holographic storage medium determines how much of a photochemical change occurs which creates the modulations in the index of refraction of the medium, which is how the holograms are stored.)

SUMMARY

According to a first broad aspect of the present invention, there is provided a system. The system comprises an external cavity laser having a laser cavity comprising a laser medium for generating laser light, a movable wavelength tuning element spaced from the laser medium for receiving at least a portion of the laser light, and two or more partially reflective optical surfaces which provide feedback of laser light to the laser medium and define the operating mode of the laser cavity, a positional light source which generates positional light, and a position sensitive detector which receives at least a portion of the positional light, wherein the positional light source is connected to the wavelength tuning element so that, as the wavelength tuning element moves, the positional light source moves along a track, wherein, in receiving the portion of the positional light, the position sensitive detector thereby determines a position of the wavelength tuning element based on movement of the positional light source along the track.

According to a second broad aspect, there is provided a method for determining the position of a diffraction grating of an external cavity laser. The method comprises the following steps (a) providing an external cavity laser system comprising an external cavity laser having a laser cavity comprising a laser medium for generating laser light, a movable wavelength tuning element spaced from the laser medium for receiving at least a portion of the laser light, and two or more partially reflective optical surfaces which provide feedback of laser light to the laser medium and define the operating mode of the laser cavity, a positional light source which generates positional light, and a position sensitive detector which receives at least a portion of the positional light, and (b) determining a position of the wavelength tuning element based on detection by the position sensitive detector of movement of the positional light source along a track, wherein the positional light source is connected to the wavelength tuning element so that, as the wavelength tuning element moves, the positional light source moves along the track.

According to a third broad aspect of the present invention, there is provided a system. The system comprises an external cavity laser having laser cavity comprising a laser medium for generating laser light, a wavelength tuning element spaced from the laser medium for receiving at least a portion of the laser light, and two or more partially reflective optical surfaces which provide feedback of laser light to the laser medium and define the operating mode of the laser cavity, a positional light source which generates positional light, a position sensitive detector, a movable assembly spaced from the positional light source and the position sensitive detector and which moves along a track, wherein the wavelength tuning element is mounted on the movable assembly, and a reflector mounted on the movable assembly which receives and reflects at least a portion of the positional light towards the position sensitive detector, wherein, in receiving the reflected portion of the positional light, the position sensitive detector thereby determines a position of the wavelength tuning element based on movement of the movable assembly along the track.

According to a fourth broad aspect, there is provided a method for determining the position of a diffraction grating of an external cavity laser. The method comprises the following steps, (a) providing an external cavity laser system comprising an external cavity laser having a laser for generating laser light, a wavelength tuning element spaced from the laser for receiving at least a portion of the laser light, and a laser cavity positioned adjacent the laser, a positional light source which generates positional light, a position sensitive detector, a movable assembly spaced from the positional light source and the position sensitive detector and which moves along a track, wherein the wavelength tuning element is mounted, and a reflector mounted on the movable assembly which receives and reflects at least a portion of the positional light towards the position sensitive detector, and (b) detecting the movement of the movable assembly along the track by the position sensitive detector receiving the reflected portion of the positional light to thereby determine a position of the wavelength tuning element.

According to a fifth broad aspect of the present invention, there is provided a system. The system comprises a laser for generating laser light, and a beam-shearing mode sensor which receives at least a portion of the laser light, wherein a laser mode of the laser is determined based on a contrast ratio of a fringe pattern created by the mode sensor receiving the portion of the laser light or a power output of the laser is determined based on a total integrated signal in the fringe pattern created by the mode sensor receiving a portion of the laser light.

According to a sixth broad aspect, there is provided a method for determining a longitudinal laser mode or power output of a laser in a laser system. The method comprises the following steps (a) providing a laser system comprising a laser for generating laser light, and a beam-shearing mode sensor which receives at least a portion of the laser light, and (b) determining a laser mode of the laser based on a contrast ratio of a fringe pattern created by the mode sensor receiving the portion of the laser light or a power output of the laser based on the total integrated signal in the fringe pattern created by the mode sensor receiving a portion of the laser light.

According to a seventh broad aspect of the present invention, there is provided a system. The system comprises an external cavity laser having a laser cavity comprising a laser medium for generating laser light, and a transmissive diffraction grating spaced from the laser for receiving a wherein the transmissive diffraction grating creates at least one non-output beam, and one or more sensors for receiving the at least one non-output beam to monitor the external cavity laser.

According to an eighth broad aspect, there is provided a method for using a non-output beams from a transmissive diffraction grating of an external cavity laser for monitoring the external cavity laser. The method comprises the following steps (a) an external cavity laser system comprising an external cavity laser having a laser cavity comprising a laser medium for generating laser light, and a transmissive diffraction grating spaced from the laser medium for receiving at least a portion of the laser light, wherein the transmissive diffraction grating creates at least one non-output beam, and one or more sensors for receiving the at least one non-output beam to monitor the external cavity laser, and (b) monitoring the external laser cavity by the one or more sensors receiving the at least one non-output beam.

BRIEF DESCRIPTION OF THE DRAWINGS

Embodiments of the present invention will be described in conjunction with the accompanying drawings, in which:

FIG. 3 is a top plan view schematically illustrating an embodiment for wavelength measurements in ECLs/ECLDs involving a reflector attached to a mechanical assembly which moves relative to the light source (i.e., light emitting diode (LED));

FIG. 4 is a side view of the embodiment shown in FIG. 3;

DETAILED DESCRIPTION

Figure 1:
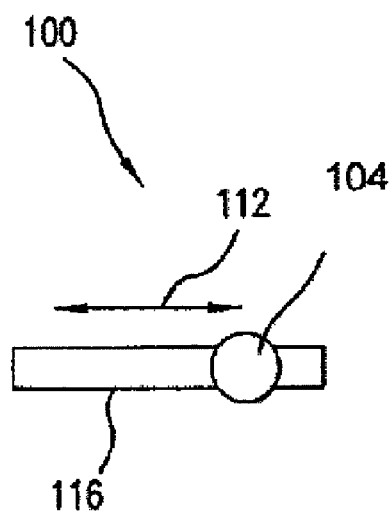
FIG. 1 is a top plan view schematically illustrating an embodiment for wavelength measurements in external cavity lasers (ECLs) or external cavity laser diodes (ECLDs) involving a position sensitive detector (PSD)

It is advantageous to define several terms before describing the invention. It should be appreciated that the following definitions are used throughout this application.
Definitions Where the definition of terms departs from the commonly used meaning of the term, applicant intends to utilize the definitions provided below, unless specifically indicated.

For the purposes of the present invention, directional terms such as "top", "bottom", "above", "below", "left", "right", "horizontal", "vertical", "up", "down", etc., are merely used for convenience in describing the various embodiments of the present invention. The embodiments of the present invention may be oriented in various ways. For example, the devices, diagrams, graphs, images, etc., shown in FIGS. 1 through 22 may be flipped over, rotated by 90° in any direction, reversed, etc.

For the purposes of the present invention, a value or property is "based" on a particular value, property, the satisfaction of a condition, or other factor, if that value is derived by performing a mathematical calculation or logical decision using that value, property, condition, or other factor.

For the purposes of the present invention, the term "light source" refers to a source of electromagnetic radiation having a single wavelength or multiple wavelengths. The light source may be from a laser, a laser diode, a light emitting diode (LED), etc.

For the purposes of the present invention, the terms "collimated beam" or "collimated light" refer interchangeably to a beam/light whose rays are nearly parallel, and therefore spread or converge slowly as the beam/light propagates.

For the purposes of the present invention, the terms "holographic grating," "holograph" or "hologram" (collectively and interchangeably referred to hereafter as "hologram") are used in the conventional sense of referring to an interference pattern formed when a signal beam and a reference beam interfere with each other. In cases where digital data is recorded page-wise, the signal beam may be encoded with a data modulator, e.g., a spatial light modulator, etc.

For the purposes of the present invention, the term "holographic recording" refers to the act of recording a hologram in a holographic storage medium. The holographic recording may provide bit-wise storage (i.e., recording of one bit of data), may provide storage of a 1-dimensional linear array of data (i.e., a 1×N array, where N is the number linear data bits), or may provide 2-dimensional storage of a page of data.

For the purposes of the present invention, the term "holographic storage medium" refers to a component, material, etc., that is capable of recording and storing, in three dimensions (i.e., the X, Y and Z dimensions), one or more holograms (e.g., bit-wise, linear array-wise or page-wise) as one or more patterns of varying refractive index imprinted into the medium. Examples of holographic media useful herein include, but are not limited to, those described in: U.S. Pat. No. 6,103,454 (Dhar et al.), issued Aug. 15, 2000; U.S. Pat. No. 6,482,551 (Dhar et al.), issued Nov. 19, 2002; U.S. Pat. No. 6,650,447 (Curtis et al.), issued Nov. 18, 2003, U.S. Pat. No. 6,743,552 (Setthachayanon et al.), issued Jun. 1, 2004; U.S. Pat. No. 6,765,061 (Dhar et al.), Jul. 20, 2004; U.S. Pat. No. 6,780,546 (Trentler et al.), issued Aug. 24, 2004; U.S. Patent Application No. 2003-0206320, published Nov. 6, 2003, (Cole et al), and U.S. Patent Application No. 2004-0027625, published Feb. 12, 2004, the entire contents and disclosures of which are herein incorporated by reference.

For the purposes of the present invention, the term "data page" or "page" refers to the conventional meaning of data page as used with respect to holography. For example, a data page may be a page of data, one or more pictures, etc., to be recorded or recorded in a holographic storage medium.

For the purposes of the present invention, the term "recording light" refers to a light source used to record information, data, etc., into a holographic storage medium.

For the purposes of the present invention, the term "recording data" refers to storing or writing holographic data in a holographic storage medium.

For the purposes of the present invention, the term "reading data" refers to retrieving, recovering, or reconstructing holographic data stored in a holographic storage medium.

For the purposes of the present invention, the term "data modulator" refers to any device that is capable of optically representing data in one or two-dimensions from a signal beam.

For the purposes of the present invention, the term "spatial light modulator" refers to a data modulator device that is an electronically controlled, active optical element.

For the purposes of the present invention, the term "data beam" refers to a recording beam containing a data signal. As used herein, the term "data modulated beam" refers to a data beam that has been modulated by a modulator such as a spatial light modulator (SLM).

For the purposes of the present invention, the term "positional light source" refers to a source of light which may be used for determining, directly or indirectly, the position of a diffraction grating.

For the purposes of the present invention, the term "light emitting diode (LED)" refers to a semiconductor diode which may be a source of light and which may have a single wavelength or multiple wavelengths. An LED may be used as positional light source.

For the purposes of the present invention, the term "laser diode" refers to a laser where the active medium is a semiconductor similar to that found in a LED which may operate to generate, produce, etc., a laser light (beam), and which may have a single wavelength (single mode) or multiple wavelengths (multi-modes).

For the purposes of the present invention, the term "external cavity laser (ECL)" refers to a device comprising a first reflective optical element, a laser or laser medium (gas, liquid, or solid such as a semiconductor), a wavelength tuning element such as a diffraction grating or an etalon), and at least one external reflective element which, in combination with the first reflective optical element, may be used to introduce optical feed back into the gain medium (e.g., laser diode chip). For example, the first reflective surface may be a part of the laser or laser medium, such as in the case of a laser diode. The diffraction grating may also comprise the second reflective element which forms the external laser cavity. When the ECL uses a laser diode, the ECL is referred to as an "external cavity diode laser" or "external cavity laser diode" (hereinafter collectively referred to as an "ECLD"). This external reflective element may be referred to interchangeably as a "laser cavity," "(external) optical cavity," "optical resonator," or "laser resonator" (hereafter referred to collectively as "laser cavity"). This laser cavity may be used to convert a single wavelength of light emitted from the laser diode having a predetermined bandwidth to a specific wavelength. In the case of an etalon-based ECLD with a laser diode, the etalon may be placed intra-cavity, i.e., between the laser diode and the second reflective optical element. ECLDs may comprise a laser diode chip having one end provided with an anti-reflection (AR) coating, while the other end has at least a partial reflection (PR), and often has a high reflection (HR), coating, with the laser cavity extending from the HR coating end to a diffraction grating (known as a "Littrow" or "Littman-Metcalf" configuration) to provide a single mode of light. A collimating lens may also be provided between the AR coating and the diffraction grating (or etalon) to provide a collimated beam/light, as well as an output coupler mirror (positioned to receive the output beam from the diffraction grating/etalon) to exclude other wavelengths to provide an extremely long coherent wavelength. Alternatively, the ECL/ECLD may use a laser cavity based on an optical fiber with the optical feedback coming from a fiber Bragg grating, for which the laser mode state and/or power output of the laser may be determined using a beam-shearing mode sensor. See also, for example, commonly-assigned U.S. Pat. No. 7,495,838 (Krneta et al.), issued Feb. 24, 2009, the entire contents and disclosure of which is hereby incorporated by reference, for an illustrative ECLD having an AR coating on one facet of the diode crystal and a HR coating on the other, opposite facet of the diode crystal.

For the purpose of the present invention, the terms "laser cavity," "optical cavity," "optical resonator," or "laser resonator" (hereafter collectively referred to as "laser cavity") refers to a space between two reflective devices, elements, etc., of an ECL/ECLD. Exemplary laser cavities may comprise, for example, the space between a reflective coating on a facet of a laser diode and a partially-reflective mirror, the space between a reflective coating on a facet of a laser diode and a diffraction grating, etc.

For the purpose of the present invention, the term "external laser cavity" refers to a laser cavity which is external to a component of an ECL/ECLD which is the source of the photons and optical gain. Exemplary external laser cavities comprise the portion of an ECL/ECLD between a laser/laser diode and a diffraction grating (including any collimating lens positioned between the laser/laser diode and the diffraction grating), etc. External laser cavities often provide control over the longitudinal and/or transverse mode structure of the laser/laser diode of the ECL/ECLD.

For the purposes of the present invention, the terms "mode" and "longitudinal mode" refer interchangeably to a wavelength (or wavelengths) of light generated by a laser light source.

For the purposes of the present invention, the terms "single mode" and "single longitudinal mode" refer interchangeably to a single wavelength of light generated by a laser light source. For example, a single mode laser diode produces a single dominant wavelength. FIG. 4 of commonly-assigned U.S. Pat. No. 7,397,571 (Krneta et al.), issued Jul. 8, 2008, the entire disclosure and contents of which is hereby incorporated by reference, illustrates an exemplary fringe pattern for a single mode laser.

Figure 5:
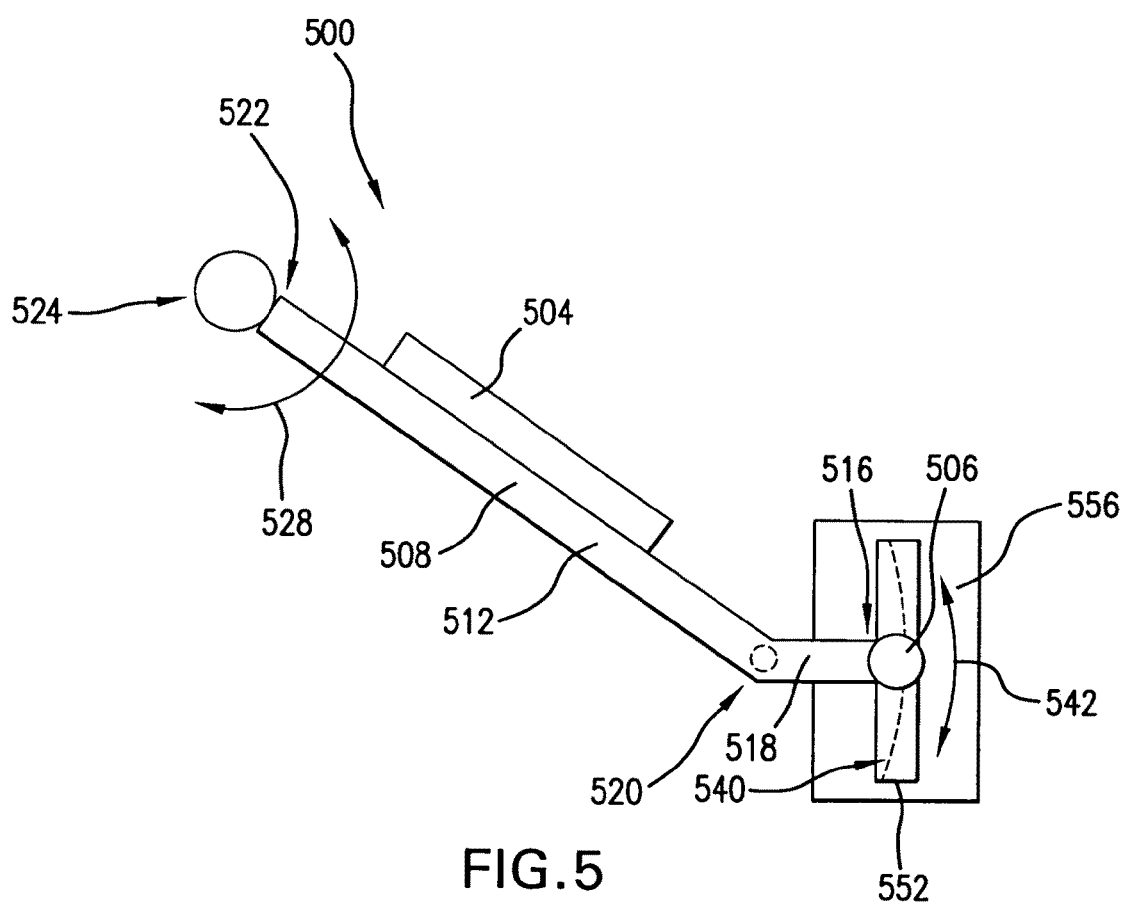
FIG. 5 is a top plan view of a schematic illustration of an embodiment of a wavelength sensor for a transmissive diffraction grating.

For the purposes of the present invention, the terms "multimode" and "multiple longitudinal mode" refer interchangeably to multiple wavelengths of light generated by the laser light source. For example, a multi-mode laser diode produces multiple wavelengths of light with significant power. FIG. 5 of commonly-assigned U.S. Pat. No. 7,397,571 (Krneta et al.), issued Jul. 8, 2008, the entire disclosure and contents of which is hereby incorporated by reference, illustrates an exemplary fringe pattern for a multi-mode laser.

For the purposes of the present invention, the term "primary mode" refers to the longitudinal mode of a laser cavity with the most optical power in the optical spectrum of the beam output from the laser cavity.

For the purposes of the present invention, the term "side mode" refers to any longitudinal mode of a laser cavity, other than the primary mode, which appears in the optical spectrum of the beam output from the laser cavity.

For the purpose of the present invention, the term "mode number" refers to the number of half wavelengths of a particular wavelength of light that fits within a laser cavity.

For the purpose of the present invention, the term "mode hop" refers to an integral change in the mode number that occurs during tuning of laser/laser diode.

For the purpose of the present invention, the term "tune" refers to adjusting a device to a desired state. For example, in exemplary embodiments, a diffraction grating may be tuned by adjusting the particular wavelength reflected (or transmitted) by the diffraction grating to a desired wavelength. In other embodiments, the device may be tuned by adjusting and controlling the degree of coherence of the laser mode.

For the purposes of the present invention, the term "wavelength tuning element" refers to a diffraction grating or an etalon.

For the purpose of the present invention, the term "diffraction grating" refers to an optical component whose optical properties may be periodically modulated and which results in the incoming light exiting the grating with an angle which is dependent upon the wavelength. Diffraction gratings have a regular or repeating pattern which can split (diffract) light into a plurality of beams travelling in different directions. Diffraction gratings may be reflective or transmissive.

For the purpose of the present invention, the term "reflective diffraction grating" refers to a diffraction grating in which all, or at least most, of the light which reaches the grating is reflected. Reflective diffraction gratings comprise a reflective surface, coating, substrate, etc., which permits the non-diffracted light to be reflected from the substrate.

For the purpose of the present invention, the term "transmissive diffraction grating" refers to a diffraction grating which permits a portion of the light to pass through the grating. Transmissive diffraction gratings comprise a transparent material, element, component, structure, substrate, etc., which permits the non-diffracted light to be transmitted (pass through) through the substrate. Exemplary transmissive diffraction gratings may comprise devices capable of diffracting a portion of light at a particular wavelength which passes through the device back along the same path upon which the incoming light traveled.

For the purpose of the present invention, the term "tunable transmission grating" refers to a transmissive diffraction grating in which the particular wavelength of light reflected may be adjusted.

For the purposes of the present invention, the term "etalon" refers to a device comprising a Fabry-Perot cavity. Etalons are also sometimes referred to as Fabry-Pérot interferometers. For example, an etalon may comprise a transparent plate with two reflecting surfaces, or two parallel mirrors. Etalons may be inserted into a laser cavity to change the operation of a laser from a multi-mode state to a single mode state. See, for example, FIG. 8, as well as the corresponding description, of commonly-assigned U.S. Pat. No. 7,397,571 (Krneta et al.), issued Jul. 8, 2008, the entire contents and disclosure of which is hereby incorporated by reference.

For the purposes of the present invention, the term "non-parallel etalon (NPE)" refers to an etalon of first and second partially reflective surfaces which are oriented with a tilt angle between the surfaces. As a result of the tilt angle, the free spectral of the etalon differs across different portions of the first and second reflective surfaces. The tilt angle may reduce the amplitude of the etalon transmission or reflection as a function of changing the optical frequency of light into the etalon.

For the purpose of the present invention, the term "non-output beam" refers to a beam produced by, for example, an ECL/ECLD which does not provide output from the laser cavity. Non-output beams may include, for example, specularly reflected beams (R0), reflected diffraction order beams (R1), and/or transmitted diffraction order beams (T1).

For the purpose of the present invention, the term "transmitted beam (T0)" refers to a beam produced by the diffraction grating of an ECL/ECLD which provides output (an output beam) from the laser cavity.

For the purpose of the present invention, the term "specularly-reflected beam (R0)" refers to a beam produced by the diffraction grating of an ECL/ECLD which provides a mirror-like reflection of the light originally impacting upon the grating.

For the purpose of the present invention, the term "reflected diffraction order beam (R1)" refers to a beam produced by the diffraction grating of an ECL/ECLD which is often used to provide feedback to the laser diode.

For the purpose of the present invention, the term "transmitted diffraction beam (T1)" refers to a beam produced by the diffraction grating of an ECL/ECLD which passes through (is transmitted by) the grating.

For the purpose of the present invention, the term "shearing interferometer" refers to a testing device which comprises a plate made of, for example, a high-quality optical glass (e.g., BK-7) with extremely flat optical surfaces and usually having a slight angle between them (e.g., is wedge-shaped). When a plane wave is incident to the glass plate at an angle of 45 degrees it is reflected twice, with the two reflections being laterally separated due to the finite thickness of the plate and by the wedge shape of the plate. This "separation" is referred to as the "shear" which gives the interferometer its name. Shearing interferometers may be used to observe interference and to use this phenomenon to test the collimation of light beams, especially from laser sources (e.g., lasers/laser diodes of ECLs/ECLDs) which have a coherence length which may be a lot longer than the thickness of the shear plate so that the basic condition for interference is fulfilled.

For the purpose of the present invention, the term "angle of incidence" refers to the angle between a light ray incident on a surface and the line perpendicular to that surface (the normal) at the point of incidence.

For the purpose of the present invention, the term "fringe pattern" refers to the pattern of interference fringes formed by the interaction, intersection, interference, etc., of two or more light beams. Fringe patterns are illustrated, for example, in FIGS. 4-5 and 13, as well as the corresponding description, in commonly-assigned U.S. Pat. No. 7,397,571 (Krneta et al.), issued Jul. 8, 2008, the entire contents and disclosure of which is hereby incorporated by reference.

For the purpose of the present invention, the term "linear phase gradient" refers to a change in the optical phase of an optical beam which varies with a parameter of an optical system, such as the position across the beam profile of the optical beam. An example of a linear phase gradient, as a function of transverse position, is the difference in optical phase between two optical beams reflected by an optical wedge of glass with a constant wedge angle between the surfaces of the wedge.

For the purpose of the present invention, the term "spatial wavefront flatness" refers to the variations in optical phase measured across an optical beam over a defined spatial aperture. An optical beam with good spatial wavefront flatness shows small variations in the optical phase. An optical beam with good spatial wavefront flatness is also said to have a low wavefront error as measured with an interferometric beam quality measurement instrument, such as a Shack-Hartman camera.

For the purpose of the present invention, the term "mode sensor fringes" refers to fringes produced by the interference between two optical beams reflected from an optical wedge of glass, such as in a beam-shearing interferometer. The ratio between the maximum signal in a fringe and the minimum signal in a fringe may be used to sense the number of longitudinal cavity modes present in the optical beam incident upon a wedge of glass or beam-shearing interferometer, such as that referred to in commonly-assigned U.S. Pat. No. 7,495,838 (Krneta et al.), issued Feb. 24, 2009, the entire contents and disclosure of which is hereby incorporated by reference.

For the purpose of the present invention, the term "full-width half maximum (FWHM)" refers to an expression of the extent of a function, given by the difference between the two extreme values of the independent variable at which the dependent variable is equal to half of its maximum value.

For the purpose of the present invention, the terms "contrast ratio" or "fringe visibility" (also known as "interference visibility" or "interferometric visibility") refer interchangeably to the quantified contrast of an interference (fringe pattern) in a system which has wave-like properties. Generally, when two or more waves are combined and as the phase between them is changed (e.g., in an interferometer), the power or intensity of the resulting wave oscillates, thus forming an interference pattern. The ratio of the size or amplitude of these oscillations to the sum of the powers of the individual waves is defined as the visibility or contrast ratio.

For the purposes of the present invention, the term "total integrated signal," with reference to the power output of a laser, refers to the sum of the signal in all parts of the interference (fringe) pattern produced by a mode sensor, such as a beam-shearing mode sensor. In certain embodiments, the sum may comprise the sum total of the signal in all of the pixels in a two-dimensional or one-dimensional sensor array used to detect the interference (fringe) pattern.

For the purposes of the present invention, the terms "detector" and "sensor" refer interchangeably to any type of device capable of detecting or sensing something, for example, light. Exemplary detectors or sensors may include devices capable of detecting the presence or intensity of light, a fringe pattern, etc.

For the purpose of the present invention, the term "sensor array" refers to a set of several sensors which an information gathering device uses together data which may not be gathered from a single source. Examples of sensor arrays may include a complementary metal-oxide-semiconductor (CMOS) camera, a charged coupled detector (CCD), a quad cell photodiode, etc.

Figure 11:
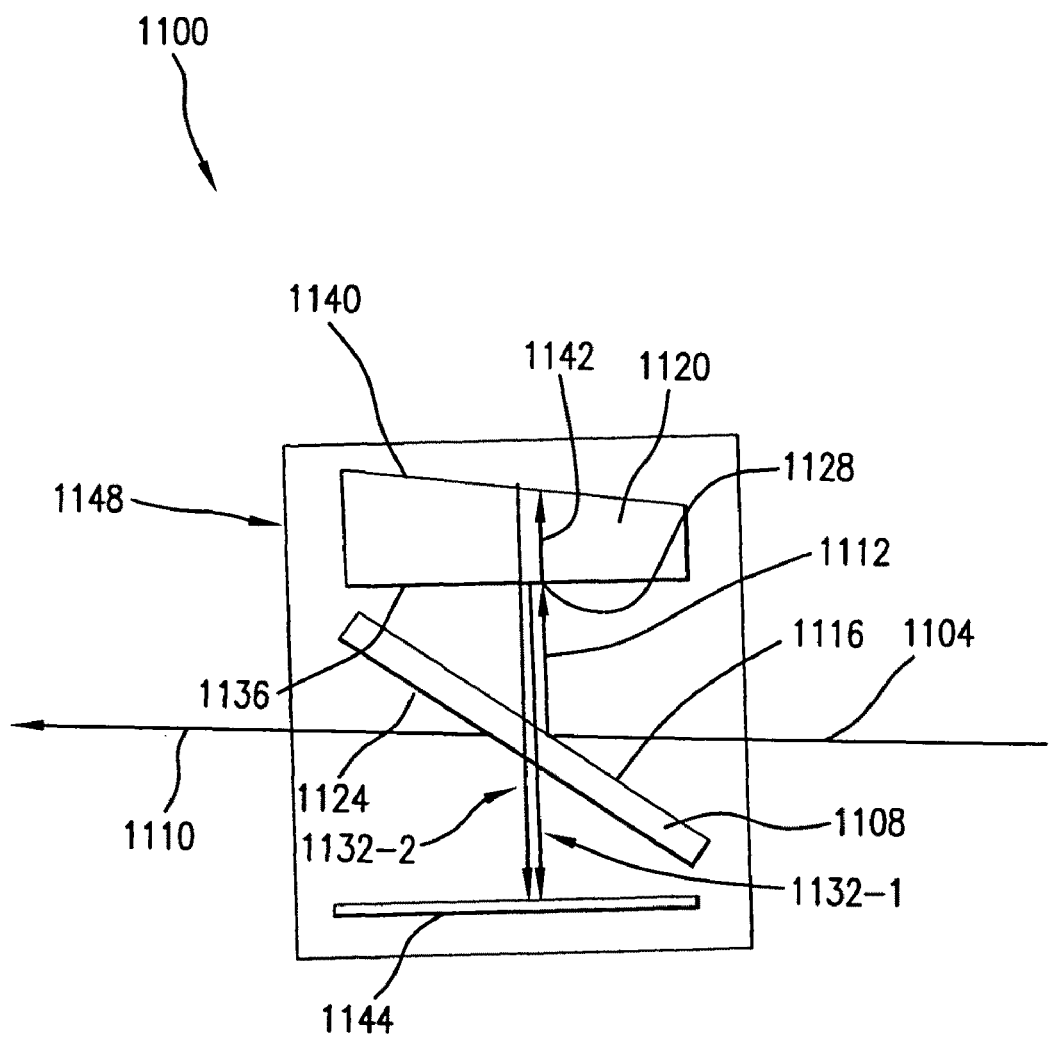
FIG. 11 is a schematic illustration of an embodiment of a beam-shearing mode sensor system comprising a beamsplitter, an optical wedge, and a detector.
Figure 12:
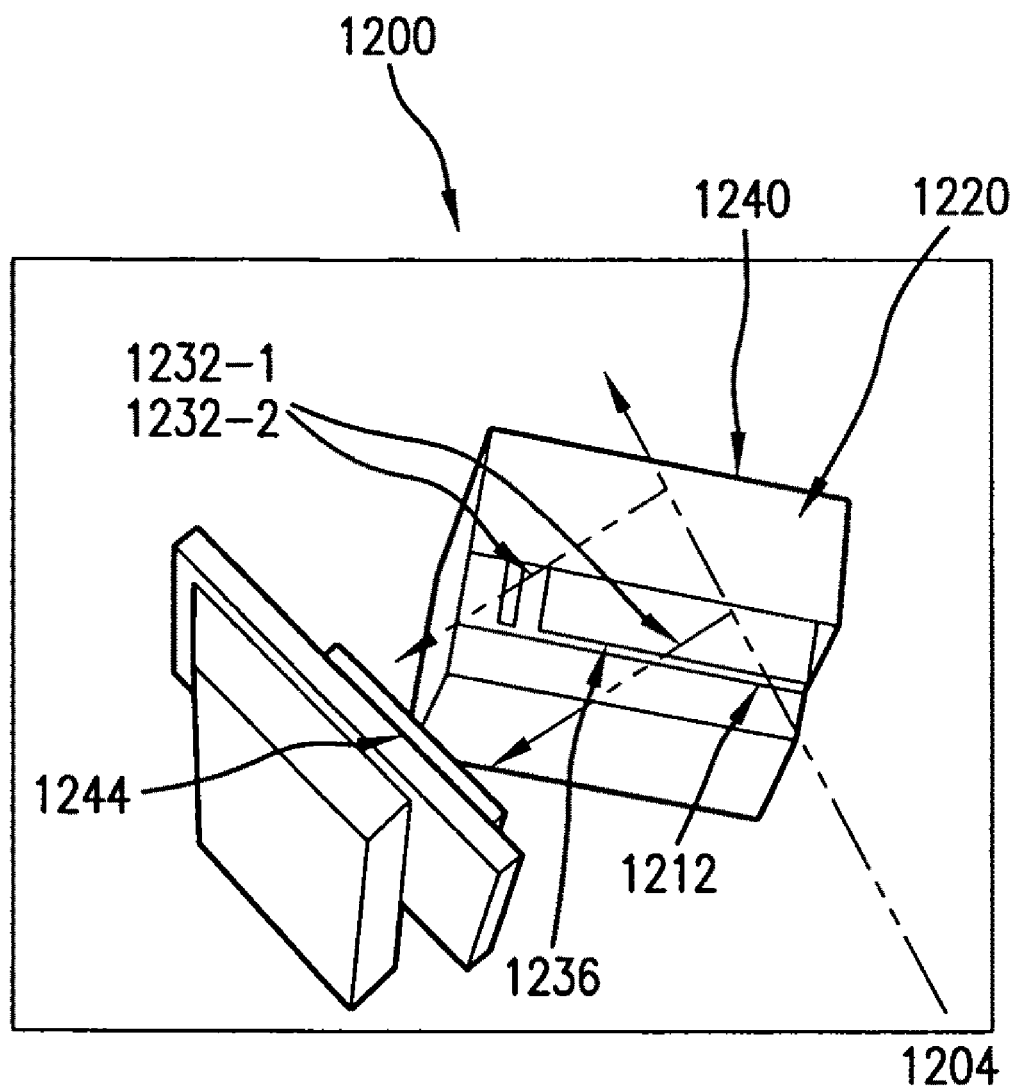
FIG. 12 is a perspective view of a variation of the schematic beam-shearing mode sensor embodiment of FIG. 11 with a 35 degree angle of incidence relative to the front surface of the optical wedge.
Figure 13:
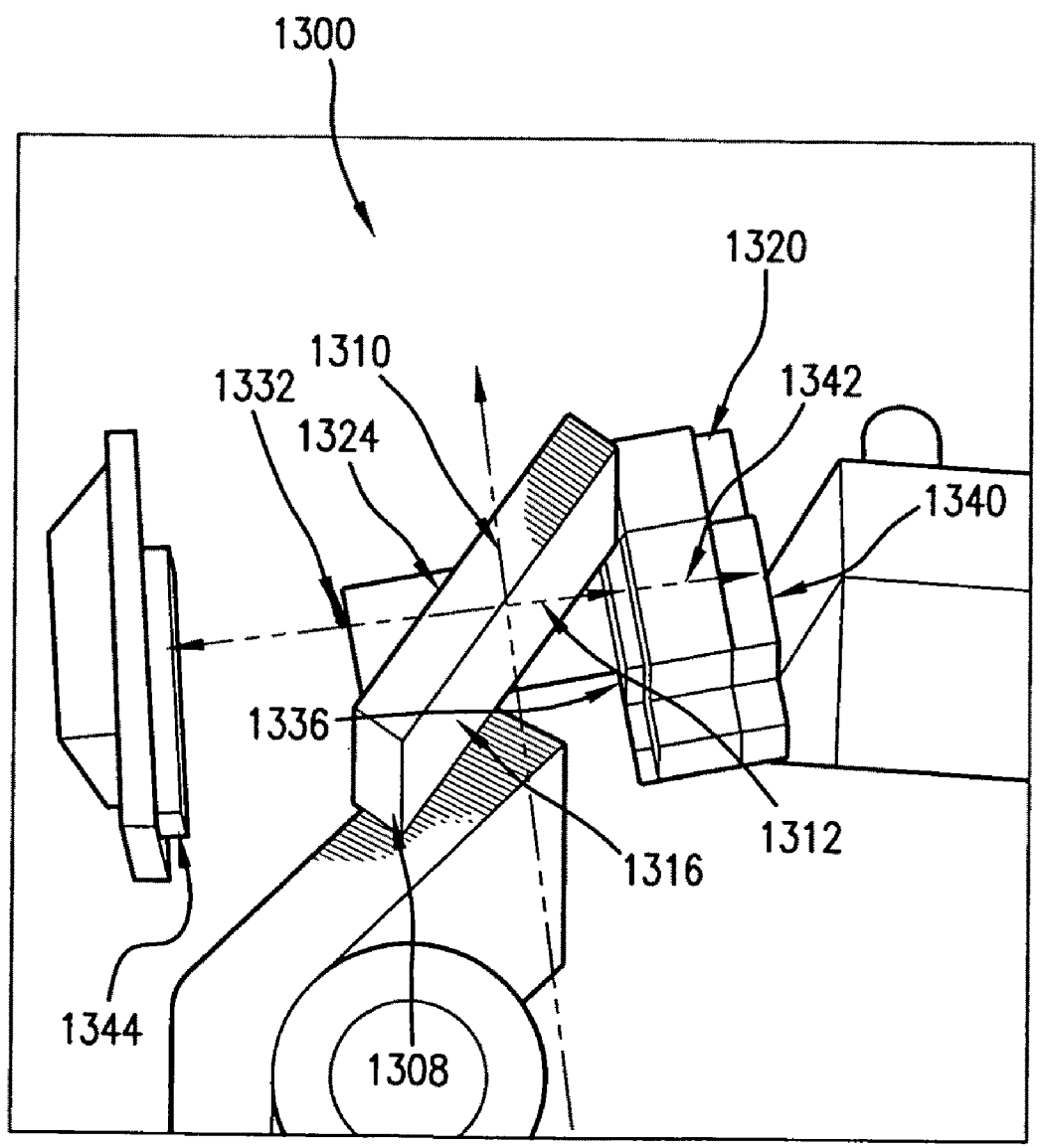
FIG. 13 is a perspective view of a variation of the mode sensor of FIG. 11, but with a 0 degree angle of incidence relative to the front surface of the optical wedge.

For the purpose of the present invention, the term "beam-shearing mode sensor" refers to an optical sensor which accepts or receives an input optical beam, splits the input beam into two or more beams which overlap and interfere with each other, and which measures the degree of interference on a detector as a measurement of the number of optical wavelengths in the optical spectrum of the input beam. The input optical beam may come from a laser or laser diode (e.g., from an ECL/ECLD), which may operate in one or more longitudinal modes of the laser cavity. The interference pattern may be measured by the beam-shearing mode sensor to determine the number of longitudinal modes in the input optical beam. The beam-shearing mode sensor may split the input optical beam such that the two or more beams resulting from the split are separated and offset spatially (or sheared) upon overlap. The two or more optical beams may also be split or interfered such that a relative optical phase difference is created between the two or more optical beams. An example of a beam-shearing mode sensor is illustrated in FIGS. 11-13.

For the purposes of the present invention, a "periodic sensor array" refers to a sensor comprised of substantially similar subunits (pixels) in a periodic placement pattern along a line or in a regular spatial grid. Examples of periodic sensor arrays include one-dimensional CMOS linear arrays or CCD camera sensors, etc. The sensors may be electro-optical, but a periodic array of chemically sensitive pixels may also be used as a periodic sensor array. Periodic sensor arrays are in contrast to certain non-periodic arrays of photodiodes which are spatially separated with dissimilar materials or variable sensor spacings.

For the purpose of the present invention, the term "position sensitive detector (PSD)" refers to a device which detects and enables position measurements to be made, determined, calculated, etc. The PSD may be one-dimensional (linear), two-dimensional, or three-dimensional. PSDs may include a photodiode array (e.g., a bicell or quad cell photodiode), a diffraction grating sensor, CMOS camera, a CCD (e.g., a CCD linear array), etc.

For the purpose of the present invention, the term "residuals" refers to the differences in values between a measured observable quantity of a system and a predicted value for the observable quantity. The predicted value may be provided by a physical model which is fit to the overall data set for the system using a standard approach such as a least-squares fit algorithm.

For the purpose of the present invention, the term "side-lock technique" refers to a method of servo control of a system in which an observable quantity of a system changes as a control variable of the system is changed. The change in the observable quantity may appear as a peak or as a substantial shift from one value to another different value. The servo control may define a set-point value at some value of the observable quantity over which the observable quantity varies with the control (such as, for example, on the side of the peak or the change region from one plateau to another different plateau level). Differences in the observable quantity from the set-point value are sometimes referred to as errors or an error signal. The error signal may be processed by the servo, using standard techniques such as, for example, a PID loop, and feedback may be given to the control variable to return the system observable quantity to the set-point value. Thus, the servo system may be "locked" to the set point value using a changing region in an observable quantity of the system.

For the purposes of the present invention, the term "monitor" may refer to measuring, checking, determining, analyzing, etc., the performance, power, longitudinal mode, beam position and/or pointing, etc., of the laser, including any components, such as the diffraction grating, etalon, etc., of the laser.

For the purposes of the present invention, the term "processor" refers to a device capable of, for example, executing instructions, implementing logic, calculating and storing values, etc. Exemplary processors may include application specific integrated circuits (ASIC), central processing units, microprocessors, such as, for example, microprocessors commercially available from Intel and AMD, etc.

Description

One challenge of operating over a wide wavelength range is knowing the wavelength that the laser is operating at, such as in the case of an external cavity laser (ECL), such as external cavity laser diode (ECLD). In ECLs/ECLDs, the external laser cavity may include a diffraction grating (or alternatively, an etalon, as described below). This diffraction grating may be reflective or transmissive. Reflection of a diffraction order back to or towards the laser/laser diode causes optical feedback, and a narrow spectral linewidth. The wavelength diffracted by the grating satisfies a Bragg scattering condition, $m \times \lambda = 2 \times d \times \sin(\theta)$, wherein m is the diffraction order, d is the grating spacing and $\theta$ is the angle of incidence to the grating. Physically, the wavelength of the ECL/ECLD may be determined by the angle of a diffraction grating relative to the laser light beam emitted from the laser diode. One wavelength tuning mechanism is to rotate the diffraction grating, thereby changing the wavelength of light emitted by the laser cavity. See, for example, commonly-assigned U.S. Pat. Appln. No. 2007/0223554 (Hunter et al.), published Sep. 27, 2007, the entire contents and disclosure of which is hereby incorporated by reference. Therefore, one approach to measuring the wavelength of an ECL/ECLD may be to measure the position of a portion of this grating, such as the angular position) of the grating, the spatial location or linear position of the inner end or outer end of the grating (wherein the inner and outer end are relative to the center of rotation of the grating), etc. But the wavelength accuracy required, combined with the size constraints of the typical, larger size of traditional displacement sensors, combined with the smaller overall sized allowed for the ECL/ECLD, or especially for the diffraction grating mechanism, may challenge the ability of traditional displacement sensors.

Alternatively, a rotating etalon may be used in place of the diffraction grating to tune the wavelength of the ECL/ECLD. The etalon acts as a wavelength selector for the laser cavity. Etalons possess the property that they periodically transmit light as a function of the optical frequency of the light, the peak optical transmission frequencies $v_m$ are given by the following equation (1):

$$v_m = m \times c / (2 \times n \times 1 \times \cos(\theta))$$

wherein m is an integer, c is the speed of light, n is the index of refraction of the medium between the first and second surfaces of the etalon, 1 is the distance between the first and second surfaces to the etalon, and $\theta$ is the angle of incidence relative to the normal of the first (or second) surface of the etalon.

The interaction between the gain of the laser medium and the selective transmission of the etalon picks a unique, single-longitudinal-mode at which the laser cavity will operate. As can be seen from equation (1) above, changing the angle, $\theta$, the optical transmission frequency changes. Thus, by rotating the etalon, the single-mode frequency of the laser light may be changed.

The amount of output power from an ECL/ECLD may be important to the success of, for example, data storage applications, remote sensing (LIDAR, fiber sensing, etc.), spectroscopy, telecommunications, atom optics and atomic clocks, etc. The need for conditioning optics (such as optical isolators which act as one-way valves for light to prevent back reflections from returning from the laser beam and interacting with the laser cavity, thus potentially. destabilizing the laser cavity, anamorphic prism pairs, pinholes, etc.) decreases the power available to the end user. Therefore, it may be beneficial to not split off additional power from the laser/laser diode output for laser/laser diode diagnostics.

In ECLs/ECLDs based on transmissive diffraction gratings for the external laser cavity, the grating may produce upwards of four beams from one input beam: a transmitted beam (T0); a specularly reflected beam (R0); a reflected diffraction order beam (R1); and a transmitted diffraction order beam (T1). The R1 beam provides the feedback to the laser/laser diode. The T0 beam provides the output from the laser cavity. But the R0 and T1 beams are generally unused, and may therefore be available for ECL/ECLD monitoring, such as, for example, performance, power, mode state, or wavelength measurements of the external cavity laser, measuring the laser beam pointing or position, measuring the laser beam wavefront quality or laser beam profile, etc.

1. Measuring Wavelengths of ECLDs and Determining Grating Position

One aspect of the present invention is a device, system, method, and/or technique for encoding the position of a portion of a diffraction grating in an ECL/ECLD by using a light source (such as an LED) connected to the diffraction grating structure, with the light source being directed at a position sensitive detector (PSD). The PSD measures the diffraction grating position, which may then be calibrated to the output wavelength of the ECL/ECLD. In some embodiments, the light source may or may not be collimated.

Figure 2:
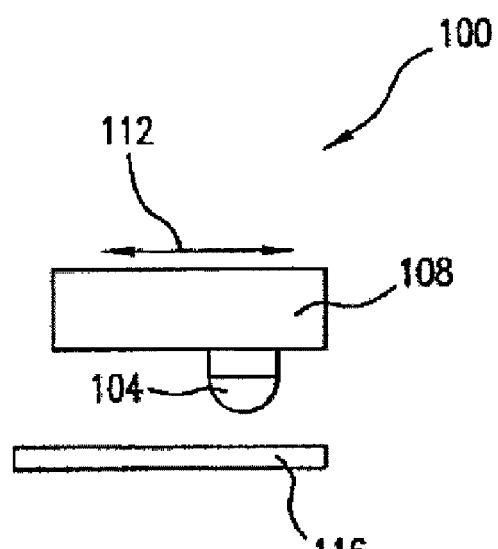
FIG. 2 is a side view of the embodiment shown in FIG. 1.

One such embodiment for measuring the diffraction grating position using a PSD for calibration to the output wavelength of an ECL/ECLD is schematically illustrated in FIGS. 1 and 2, and is referred to generally as system 100. As shown in FIGS. 1 and 2, system 100 includes a light source, indicated as 104. Light source 104 is mounted on, for example, a movable mechanical assembly, indicated generally as 108, to which a diffraction grating (not shown) is connected to (e.g., attached to, mounted on, etc.). As shown in FIGS. 1 and 2, assembly 108 moves linearly and laterally back and forth along a track (e.g., may be along a linear path as shown in FIGS. 1 and 2, may be along the radius of a curve or circle when assembly 108 is rotated or pivoted at one end about a pivot point to change the position of the diffraction and thus the wavelength of the laser, etc.), as indicated by double-headed arrow 112. Light source 104 is also mounted on assembly 108 so as to point towards a position sensitive detector (PSD), which is generally indicated as 116. PSD 116 may be, for example, a two-dimensional sensor array such as a two-dimensional CMOS camera, a two-dimensional CCD, a quad cell photodiode, or other two-dimensional PSD. In some embodiments of system 100, a linear (one-dimensional) sensor 116 may be sufficient to detect the motion of light source 104. Examples of suitable detectors for linear position detection may include CMOS linear arrays, CCD linear arrays, bicell photodiodes, or other linear PSDs.

One embodiment may use a one-dimensional (linear) PSD to measure two photocurrents from the PSD. The difference in the two photocurrents, divided by the sum of those two photocurrents, is proportional to the position of the positional light source relative to a reference point on the PSD (often the center of the PSD for linear PSDs). It should be understood that this subtraction/division operation may be performed in a variety of ways, for example, by analog electronics, as photocurrents, after transimpedance amplification into voltage signals, after digitization of the signals and computation by a signal processor, etc.

In other embodiments, the positional light source need not be connected to (e.g., attached to, mounted on, etc.) the mechanical structure or assembly to which the diffraction grating is connected to (e.g., attached to, mounted on, etc.). For example, the positional light source may be located next to or proximate the PSD, but may be directed towards (e.g., upwards) the mechanical structure/assembly on which the diffraction grating is mounted, connected, attached to, etc. In one such embodiment schematically illustrated in FIGS. 3 and 4, a reflector may be positioned on the mechanical structure (on which the diffraction grating is also mounted) to reflect at least a portion of the light generated from the positional light source back to or towards the detector (e.g., PSD), which then detects the position of the reflected light, and thus the position of the diffraction grating. Referring to FIGS. 3 and 4, a system, generally indicated as 300, for wavelength measurements in an ECLD using a reflector attached to a mechanical assembly which moves relative to the positional light source (i.e., light emitting diode (LED) or laser diode) is schematically illustrated. As shown in FIGS. 3 and 4, system 300 includes a positional light source, indicated generally as 304. System 300 also includes movable mechanical assembly 308 to which a diffraction grating (not shown) is connected, and which is separate from light source 304. (Although not shown in FIG. 3 or 4, the diffraction grating may be mounted on assembly 308, for example, in an orientation coming orthogonally/vertically out of the page relative to assembly 308 as shown in FIG. 4.) As shown in FIGS. 3 and 4, assembly 308 moves approximately linearly and laterally back and forth along a track, as indicated by double-headed arrow 312. Connected to (e.g., attached to, mounted on, etc.) assembly 308 is a reflector, indicated generally as 314. System 300 further includes a PSD, which is generally indicated as 316. As shown in FIGS. 3 and 4, light source 304 is pointed at reflector 314. At least a portion of the light, indicated generally as 320, from light source 304 is reflected by reflector 314, as indicated generally by 324, and towards PSD 316. As a result, the PSD 316 detects the position of the light 324 reflected from reflector 314, and thus the position of the diffraction grating (not shown) connected to (e.g., attached to, mounted on, etc.) assembly 308.

The technique of the embodiments of the present invention for position measurement differs from that of prior PSDs. For example, some prior displacement sensors may require physical contact between a reference surface and a movable transducer. This prior approach may be unsuitable for an ECL/ECLD whose laser cavity length, as controlled by the diffraction grating location, needs to remain stable to within tens of nanometers. Other prior displacement gauges may not require contact, but may instead use capacitive detection or magnetic induction. An example is the QT113 charge-transfer touch sensor (i.e., a capacitive detector) from Quantum Research Corp which projects a proximity sensor field through the air, or any dielectric such as glass, plastic, stone, ceramic, and most kinds of wood. Capacitive or magnetic inductive sensors may rely on specific materials for them to function properly, such as those materials which can hold an induced charge or change a magnetic field. Also, capacitive and magnetic inductive sensors may have proximity requirements which restrict the distance between the sensor and the surface whose position is being measured. Furthermore, many of these prior detectors exhibit large temperature dependence. Physical transducers may expand or contract with temperature changes. Capacitance or magnetic inductance properties of materials are also thermally-dependent. By contrast, embodiments of the present invention do not rely upon material properties of the surface being sensed, and are thus relatively insensitive to changes in temperature because the measured photosignals may be normalized to eliminate changes in the absolute light level, the sensitivity of the photosensor, the gain of the detection electronics, etc.

Other prior position sensors use an LED and a single photosensor, such as the EE-SX1018 photomicrosensor from Omron Electronics LLC. These sensors sense position of a surface by a change in the absolute amount of light detected by the photosensor. Thus, as the LED changes due to changes in the power supply, or degrades due to aging, the light level may change and be incorrectly measured as a change in distance. As mentioned previously above, embodiments of the present invention may not be subject to such temperature or temporal sensitivity.

Embodiments of the present invention may have numerous benefits relative to these prior devices or techniques used for position sensing of a light source. For example, these embodiments of the present invention may require no contact between the sensor and the object whose position is under measurement. Embodiments of the present invention also may not depend upon the materials properties of the object under measurement. Embodiments of the present invention may further be operated with the PSD being positioned at a greater distance from the object under measurement (so long as the light source may still be collected by the PSD). The thermal dependence of opto-electronic position sensors may also be minimized because the position recorded by such sensors is often given by normalizing the difference in signal currents from two or more sensor elements or pixels. This is the approach used in a bicell photodetector or a one-dimensional PSD. This benefit applies to embodiments using one or two-dimensional arrays of photosensors, wherein a digital signal processor may compute the centroid of the signal on the sensor array. The centroid calculation may use the equation $(\Sigma s_i \times r_i)/\Sigma s_i$. The numerator of this centroid calculation weights each signal in the $i^{th}$ photosensor, $s_i$, on the one-dimensional array of photosensors by the position of the pixel $r_i$ from a reference point on the array. The denominator of this centroid calculation normalizes by the summation of each signal of all the pixels. The result of the centroid calculation is a weighted position of the center of the signal on the array. This centroid calculation may also be generalized to cover calculations involving two-dimensional arrays of photosensors by performing the summations in the centroid formula over all elements in the two-dimensional sensor array.

One-dimensional (linear) PSDs may measure the location of a positional light source by generating two photocurrents at both ends of the detector whose values may be determined by the location of the centroid of the light incident on the PSD. The position may given by $L/2 \times (I_1-I_2)/(I_1+I_2)$, wherein L=the length (distance) of the photosensing material comprising the PSD, and $I_1$ and $I_2$ are the photocurrents measured at both ends of the PSD. Because the position calculation divides the difference in photocurrent by the total photocurrent, any changes in the intensity of the LED are normalized out of the calculation of the position. Furthermore, since the PSD measures the centroid of the light (or portion of light), the positional light source may be a simple LED without regard for a special beam profile or size of the finite light source.

Figure 6:
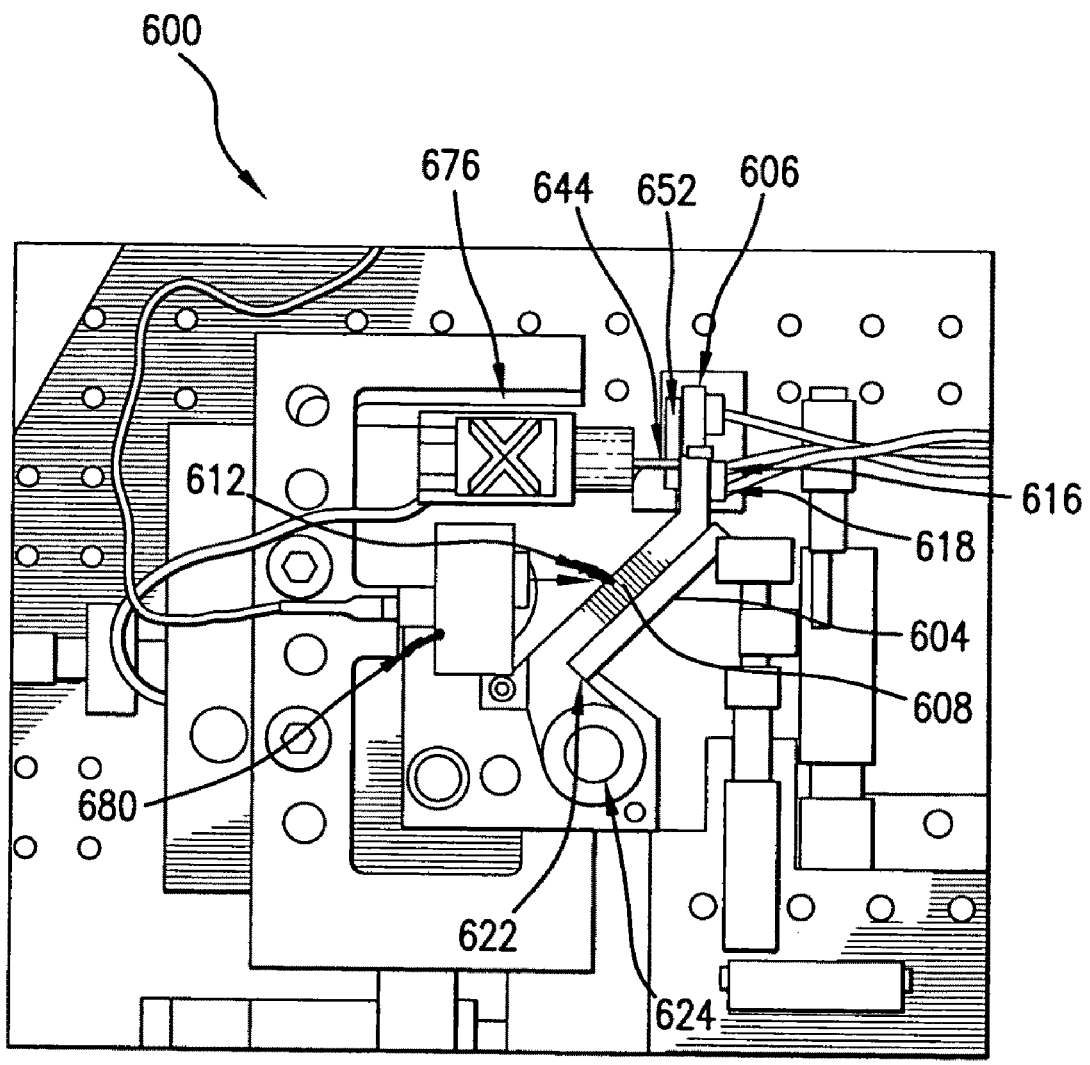
FIG. 6 is a top plan view of a sensor arrangement according to the schematic embodiment shown in FIG. 5.
Figure 7:
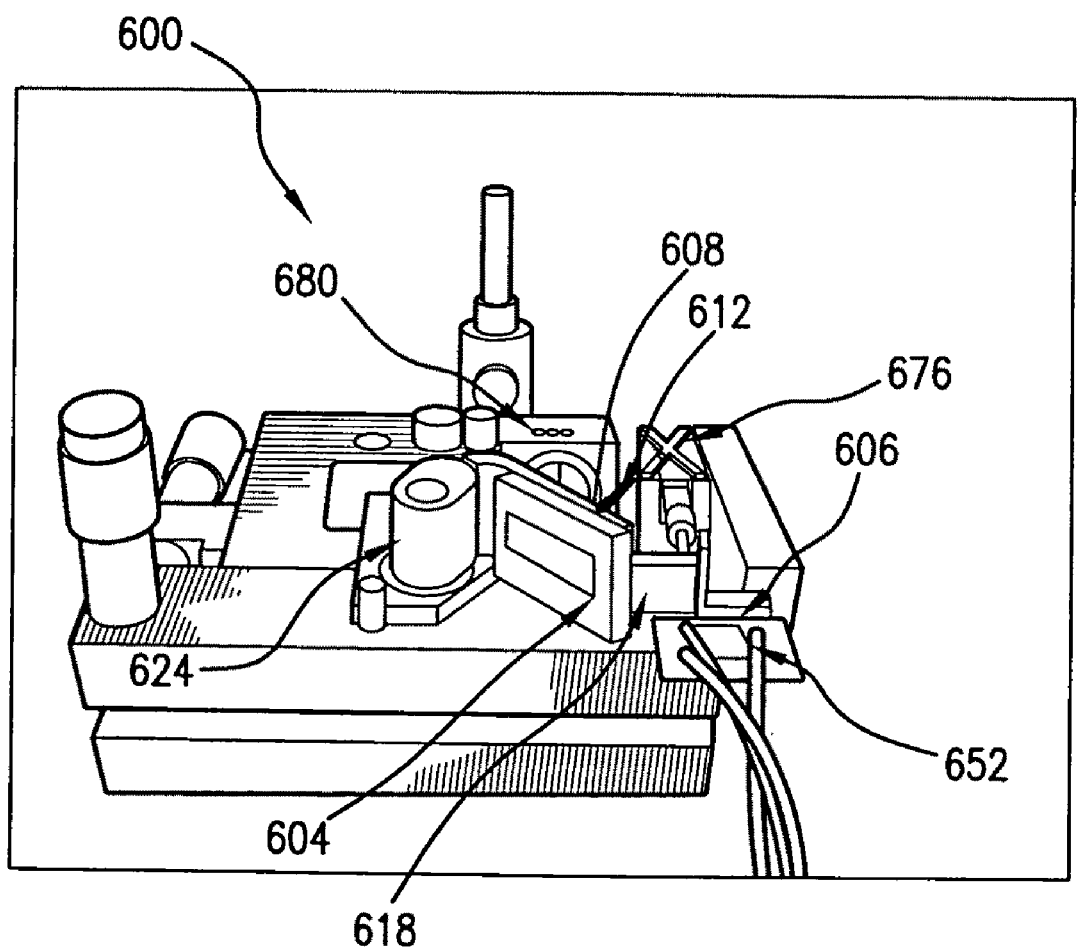
FIG. 7 is an end view of the arrangement of FIG. 6.

Some embodiments of the present invention may involve using a transmissive diffraction grating in the ECL/ECLD wherein an LED, or other positional light source, is connected to (e.g., attached, mounted on, etc.) the transmissive diffraction grating mount, frame, structure, etc., for the transmissive diffraction grating whose position being indicated, detected, sensed, determined, measured, etc. A schematic illustrating an embodiment of such a system wherein the LED is attached to transmissive diffraction grating mounting arm, frame, etc., is shown in FIG. 5 and FIGS. 6-7, and is referred to generally as 500. System 500 includes a transmissive diffraction grating 504 and a positional light source (e.g., LED) 506. Transmissive diffraction grating 504 is mounted on base segment 508 of a grating frame 512. Positional light source 506 is mounted on one end 516 of a positional light source mounting arm 518 of grating frame 512. Arm 518 is rigidly attached or connected to base segment 508 of grating frame 512. Grating frame 512 rotates or pivots at the other end 522 (spaced from end 516) about a rotation or pivot point indicated by arrow 524 so that grating frame 512 may rotate or pivot in the angular direction(s) indicated by curved double-head arrow 528 within an angular range. This angular range may be determined by the total wavelength tuning range required by the ECL/ECLD, and sustained by the finite bandwidth of the optical gain curve of the laser diode. For example, the angular range of rotation may be as little as about 1 degree. But the range of rotation may be larger (or smaller) depending upon the wavelength tuning range of the particular ECL/ECLD. In general, the angular range may given by inverting the Bragg equation. i.e., wherein the angular range is defined by the following equation (2):

$$\arcsin(\lambda_{max}/2\times d) - \arcsin(\lambda_{min}/2\times d) \qquad (2)$$

wherein $\lambda_{max}$ is the maximum wavelength, $\lambda_{min}$ is the minimum wavelength, and d is the spacing of the lines or features comprising the diffraction grating.

As grating frame 512, and therefore, transmission diffraction grating 504, pivots as shown by arrow 528, positional light source 506 travels along a curved track 540 (indicated by a dashed curved line) in the directions shown by double-headed arrow 542. In FIG. 5, positional light source 506 is aimed downwardly (i.e. into the page) towards a PSD, indicated generally as 552, which is mounted on PSD mount 556 and is located beneath positional light source 506. As positional light source 506 moves or travels along track 540, PSD 552 receives light from, and thus detects the position of, positional light source 506 along track 540. Because the motion of positional light source 506 along track 540 is linked to the rotation or pivoting of grating frame 508, and thus transmission diffraction grating 504, about rotation or pivot point 524, a particular position of positional light source 506 along track 540 corresponds to a particular angular position (see doubled-headed arrow 528) of grating frame 508, and thus transmission diffraction grating 504. Therefore, for sufficiently small rotational/pivot angles (wherein the portion of track 540 which positional light sources 506 travels along is relatively short, and thus approximately linear), or for larger diameter positional light sources 506 (e.g., a relatively large LED) relative to PSD 552, a one-dimensional (linear) PSD 552 may be used to determine the angular position of diffraction grating 504 based on the detected position of positional light source 506.

A sensor arrangement according to the schematic embodiment of system 500 using, for example, a red LED (with a large bulb diffuser head) and a Hamamatsu one-dimensional PSD (model S5629-01) is shown in FIGS. 6 and 7, and is generally indicated as 600. As shown in FIGS. 6 and 7, sensor arrangement 600 includes a transmissive diffraction grating 604 and a positional light source (e.g., LED) 606. Transmissive diffraction grating 604 is mounted on base segment 608 of grating frame 612. Positional light source 606 is mounted on an end 616 of grating arm 618. Grating arm 618 is rigidly attached or connected to base segment 612 of grating frame 608. Grating frame 612 rotates or pivots at end 622 about rotation or pivot point 624.

As grating frame 612, and therefore, transmission diffraction grating 604, pivots, grating arm 618 moves in a corresponding arc to allow positional light source 606 to travel along a track (not indicated in FIG. 6). The track which positional light source 606 travels along is a relatively small circular arc formed by light source 612 moving in conjunction with grating arm 618, as frame 612 pivots about pivot point 624. The pivotal movement of grating arm 618 is actuated by motor 676, which is connected to end 616 of grating arm 618 by a linking member which moves reciprocally in the form of, for example, a rod 644. Rod 644 may be somewhat rigid to cause or impart movement to grating arm 618, but sufficiently flexible to allow for arm 618 to move in a relatively small arc, as previously described. In FIGS. 6 and 7, positional light source 606 is aimed downwardly (i.e. into the page) towards a PSD, indicated generally as 652, located beneath positional light source 606 and light source mount 612. As positional light source 606 moves or travels along its track, PSD 652 receives light from, and detects the position of, positional light source 606 along its track. Because the motion of positional light source 606 along its track is linked to the pivoting of grating frame 608, and thus to transmission diffraction grating 604, a particular position of positional light source 606 along its track corresponds to a particular angular position of grating frame 612, and thus transmission diffraction grating 604. Therefore, one-dimensional PSD 652 may be used to determine the angular position of diffraction grating 604, based on the detected position of positional light source 606.

In FIGS. 6 and 7, positional light source 606 may be located about 1 mm above PSD 652. The wavelength of collimated laser light from the laser diode of the ECLD, indicated generally as 680, is changed by actuation of motor 676 which causes or imparts reciprocating movement to rod 644. As rod 644, which is connected at end 616 to grating arm 618, moves reciprocally, movement of grating arm 618 in an arc is imparted in response to the reciprocal movement of rod 644, and thus causes frame 608 (along with grating 604) to rotate or pivot about pivot point 624. The two photocurrents from PSD 652 may be preamplified, for example, by a pair of Melles Griot amplifiers (not shown), with the voltages being acquired, for example, by a National Instruments E-series card and collected by a Lab View program.

Figure 8:
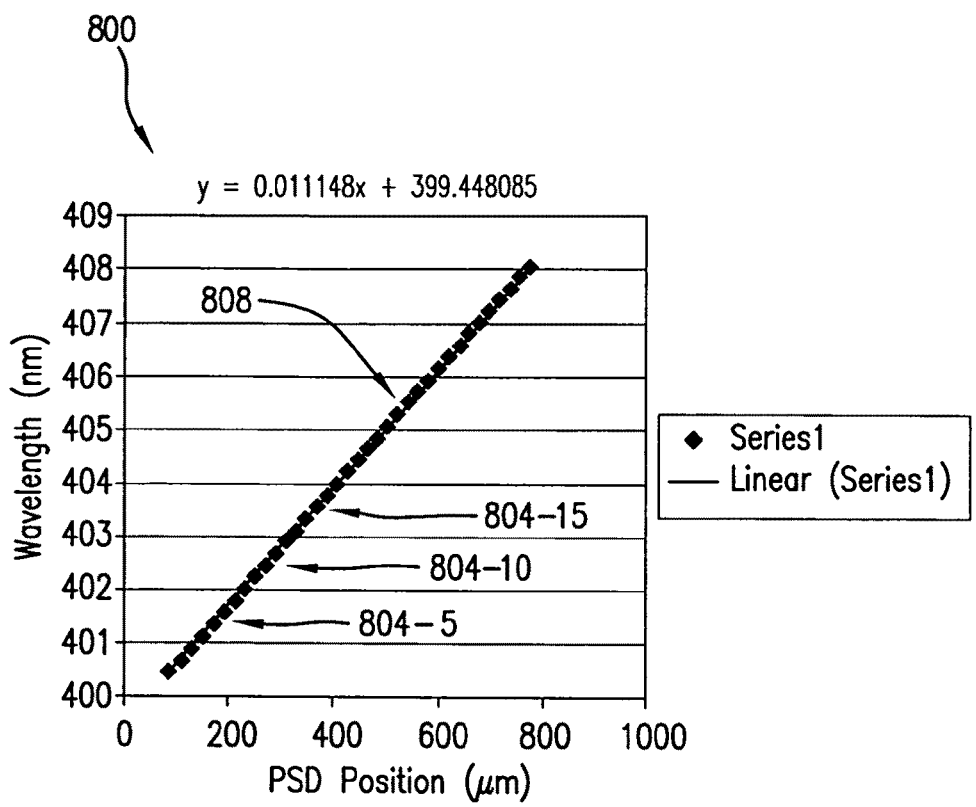
FIG. 8 is a graph of ECLD wavelength versus position measured by a PSD.

The ECL/ECLD wavelength may be calibrated as a function of the position of grating arm 618, as determined by the PSD 652, for example, by using an EXFO Wavelength meter (model WA-1000). The calibration may correlate one PSD measurement of the position of grating arm 618 with one wavelength output by the ECL/ECLD, as measured by the Wavelength Meter. The first measurement performed may involve scanning the diffraction grating over a wide range (for example, about 7.5 nm for a linear range of up to about 776 microns) to thus scan a wide range of wavelengths. FIG. 8 shows a graphical plot, indicated generally as 800, of the resulting data (see, for example, data points 804-5, 804-10, and 804-15). As shown in FIG. 8, the data provides a very good linear fit, as indicated by straight sloping line 808. The residuals from the linear fit of sloping line 808 are a measure of the accuracy of the measurement. Using the PSD measurement as the control variable, the linear fit residuals in the wavelength have a standard deviation of 23 picometers. Alternately, treating the wavelength as the control variable, the linear fit residuals in the PSD position have a standard deviation of 2 microns.

Figure 9:
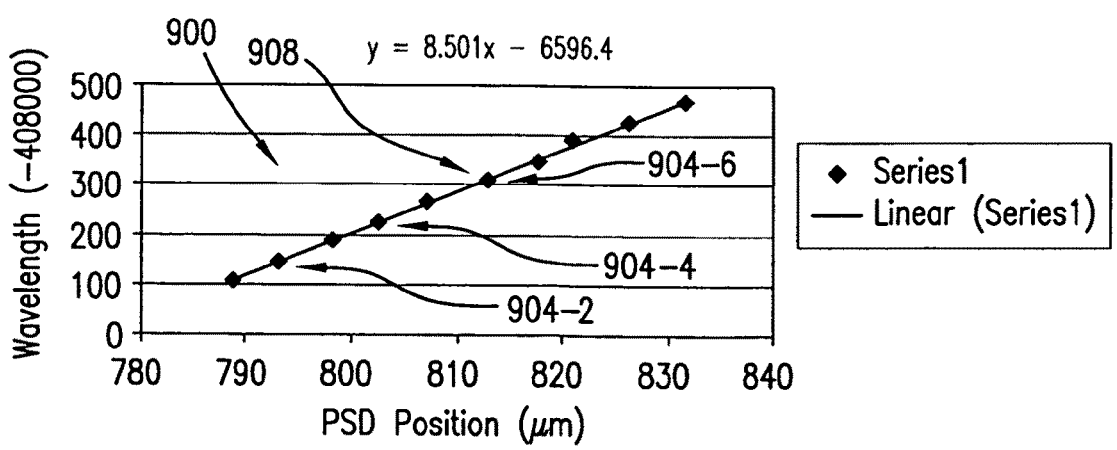
FIG. 9 is a graph similar to that of FIG. 8, but of a narrower tuning range of ECLD wavelength versus position measured by the PSD.

The sensor may be even more accurate over a shorter scan range. In this second analysis, the scan is carried out only over a range of 360 picometers of the ECLD wavelength (or about 40 microns of motion of the LED light upon the PSD). FIG. 9 shows a graphical plot, indicated generally as 900, of the resulting data (see, for example data points 904-2, 904-4, and 904-6). As shown in FIG. 9, the data again provides a very good linear fit as indicated by straight sloping line 908. The residuals from the linear fit of sloping line 903 are again a measure of the accuracy of the measurement. Using the PSD measurement as the control variable, the linear fit residuals in the wavelength have a standard deviation of 3 picometers. Alternately, treating the wavelength as the control variable, the linear fit residuals in the PSD position have a standard deviation of 0.4 microns. Hence, the PSD-based wavelength sensor is more precise over a smaller range of motion of the diffraction grating (and hence a smaller range of ECL/ECLD wavelengths) than a larger range of motion of the grating.

Figure 10:
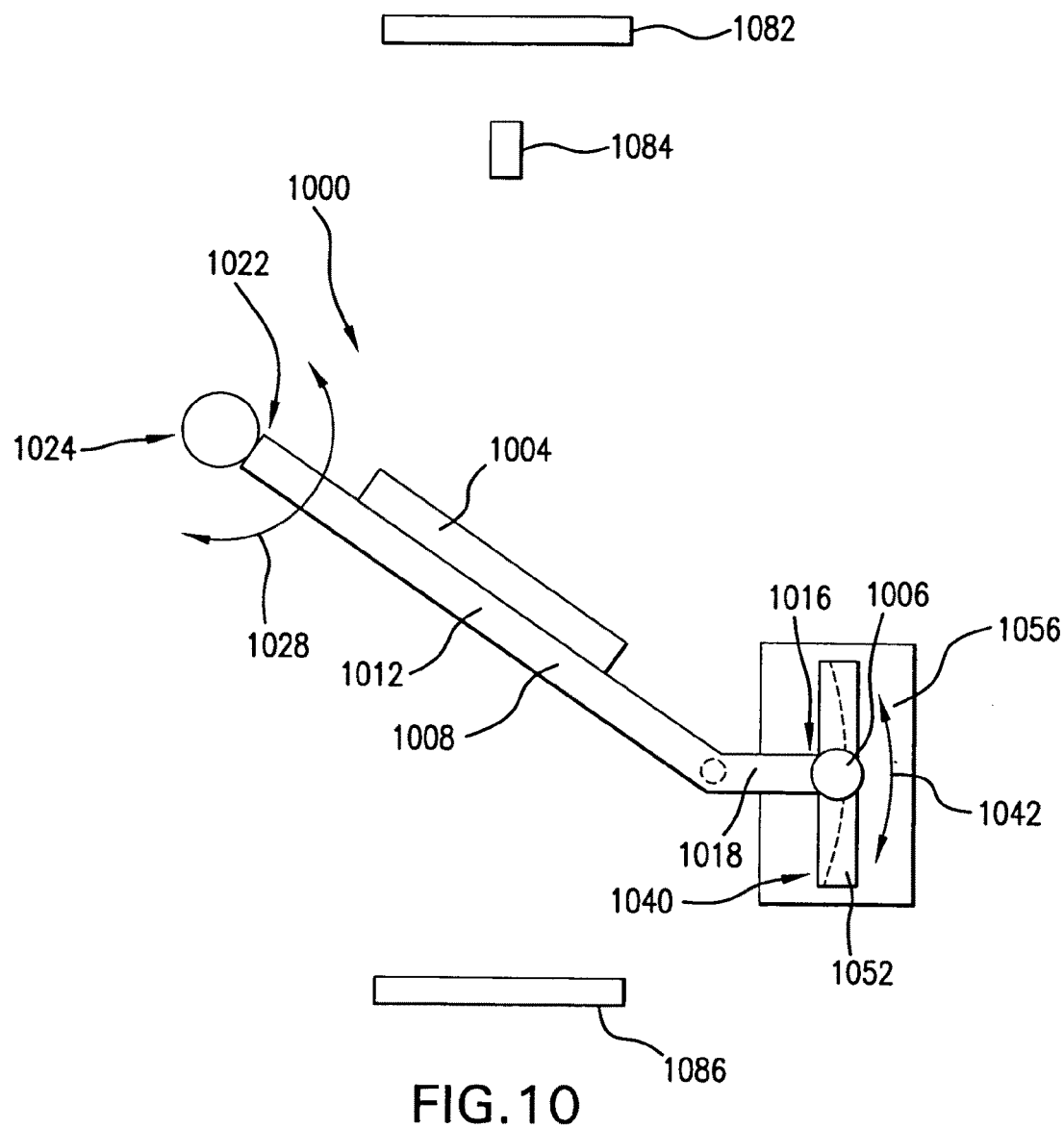
FIG. 10 is a top plan view of a schematic illustration of an embodiment of a wavelength sensor similar to FIG. 5, but with wherein the transmissive diffraction grating is replaced with an etalon as the wavelength tuning element in the laser cavity.

A wavelength sensor system for a rotating etalon is illustrated in FIG. 10, and is referred to generally as 1000. System 100 is similar to system 500, and includes an etalon 1004 (in place of diffraction grating 504 of system 500) a positional light source (e.g., LED) 1006 which mounted on base segment 1008. Positional light source 1006 is mounted on one end 1016 of a positional light source mounting arm 1018 of grating frame 1008. Arm 1018 is rigidly attached or connected to base segment 1008 of grating frame 1012. Grating frame 1012 rotates or pivots at the other end 1022 (spaced from end 1016) about a rotation or pivot point indicated by arrow 1024 so that grating frame 1012 may rotate or pivot in the angular direction(s) indicated by curved double-head arrow 1028 within an angular range. As grating frame 1012, and therefore, etalon 1004, pivots as shown by arrow 1028, positional light source 1006 travels along a curved track 1040 (indicated by a dashed curved line) in the directions shown by double-headed arrow 1042. In FIG. 10, positional light source 1006 is aimed downwardly (i.e. into the page) towards a PSD, indicated generally as 1052, which is mounted on PSD mount 1056 and is located beneath positional light source 1006. As positional light source 1006 moves or travels along track 1040, PSD 1052 receives light from, and thus detects the position of, positional light source 1006 along track 1040.

System 1000 also comprises a first cavity mirror 1082, laser medium 1084, and a second cavity mirror 1086. First cavity mirror 1082 and second cavity mirror 1086 form the laser cavity. Light is generated and amplified by laser medium 1084, with the generated light being coupled to the first and second cavity mirrors 1082 and 1086. Laser medium 1084 provides optical gain over a range of optical wavelengths, as determined by the properties of medium 1084. The length of the laser cavity between mirrors 1082 and 1086 creates longitudinal modes which the laser may choose to operate in. Mirrors 1082 and 1086 also feedback light to the laser medium 1084. The feedback of light to the laser medium enables the cavity to amplify the optical power of the laser light in one or more of the longitudinal modes of the laser cavity. Etalon 1004 provides another optical filter which is periodic in the optical frequency of the laser. Rotating etalon 1004 within the laser cavity defined by mirrors 1082 and 1086 adjusts the longitudinal cavity mode (of the laser) which possesses the most gain by shifting the location of the peaks in the optical transmission through etalon 1004. Each angle of etalon 1004 therefore selects a different wavelength with optimal gain, and thus selects the single output wavelength of the laser cavity.

2. Measuring Longitudinal Mode of Laser Diode and Using Same to Control Laser Mode Another aspect of the present invention is a device, system and/or method which detects, senses, determines, indicates, etc., the degree of coherence of a laser mode by measuring the contrast ratio/fringe visibility of the interference pattern created by a non-shearing interferometer. A shearing interferometer takes a single input beam and splits or shears it into two overlapping but laterally-displaced beams. The resulting interference pattern depends upon the mode of the laser and wavefront errors in the beam such as defocus, coma, astigmatism, or other optical effects. In a non-shearing interferometer, a single input beam is split into two beams which overlap and are not laterally-displaced. Because the beams overlap spatially, the interference pattern is very insensitive to wavefront errors in the beam. In a non-shearing interferometer receiving an optical beam from an ECL/ECLD, a single-longitudinal mode will create a higher contrast ratio/fringe visibility, whereas an ECL/ECLD with multiple-longitudinal modes will create fringes with lower contrast ratio/fringe visibility.

A key aspect of certain embodiments of the present invention is that the interference occurs between two or more overlapping beams which are not spatially displaced from each other, making the contrast ratio/fringe visibility of the optical interference fringes between the beams relatively insensitive to spatial wavefront errors but still highly sensitive to the presence of multiple longitudinal modes in the beam of the laser. A further aspect of certain embodiments of the present invention is that the fringe pattern may be detected with a periodic sensor array, such as a one-dimensional linear CMOS sensor, CCD camera, an array of photodiodes, etc. The elements (referred to hereafter as "pixels") of such an array need to be smaller compared with the wavelength of fringes created by the interferometer. The pixels to fringe wavelength ratio may be about 1:4 or less, for example, a ratio of about 1:10 or less. The ratio of the pixel size to the wavelength of the fringe may be important because this ratio determines the accuracy of the sensor in determining the signal levels which are used in calculating the contrast ratio/fringe visibility. A larger pixel size to wavelength ratio may reduce the largest fringe signals and increase the smallest fringe signals by quantizing the fringe too coarsely. The resulting effect may render the contrast ratio/fringe visibility inaccurate relative to the true value. Yet a further aspect of certain embodiments of the present invention is that, by using a periodic sensor array, the fringe signal may be processed with algorithms such as Fast Fourier Transforms (FFTs) or digital filters to calculate the contrast ratio/fringe visibility from the spatial components of the Fourier Transform or the filtered components from the digital filter.

Yet another aspect of certain embodiments of the present invention is using the contrast ratio/fringe visibility of the mode sensor as a feedback mechanism for active mode control of the ECL/ECLD. The contrast ratio/fringe visibility may be used as the error signal which drives corrections to the laser cavity, such as by adjusting the physical length of the laser cavity with, for example, an actuator (e.g., transducer), applying more or less current to a semiconductor gain material or laser diode, controlling the temperature of the laser cavity, etc. In other embodiments of the present invention, the error signal based on the contrast ratio/fringe visibility may also be used to correct the wavelength of the laser/laser diode by rotating the wavelength tuning element, such as a transmissive diffraction grating or an intra-cavity etalon An embodiment of a mode sensor may use a side-lock technique, wherein the slope of the contrast ratio/fringe visibility from the mode sensor, versus (relative to) a laser cavity length control parameter, provides the feedback to actively maintain the ECL/ECLD in a single-longitudinal mode in the laser cavity.

Embodiments of the present invention may also include improvements to a mode sensor using an optical wedge as disclosed in commonly-assigned U.S. Pat. No. 7,397,571 (Krneta et al.), issued Jul. 8, 2008 (hereafter "Krneta et al. '571), the entire contents and disclosure of which is hereby incorporated by reference. The optical wedge mode sensor of Krneta et al '571 measures the maximum and minimum fringe signal to determine a contrast ratio/fringe visibility. In some embodiments of the present invention, a near normal angle of incidence may be required to prevent beam separation in the reflections from the optical wedge, thereby suppressing the masking effects of spatial wavefront variations in the incident beam. These embodiments of the present invention may also improve upon the optical wedge mode sensor of Krneta et al '571 by using linear CMOS detectors which may require less electrical power than CCDs and which contain signal amplification with each pixel. Yet another improvement by embodiments of the present invention over the optical wedge mode sensor of Krneta et al '571 may be that the sensor is periodic which allows for the use of digital signal processing, such as FFTs or digital impulse filters, which may need periodic signal sampling to function properly. Through the use of FFTs, some embodiments of the present invention may provide a substantial suppression of the effect of finite pixel size and finite beam size on the measured contrast ratio, as well as suppression of the skewing effect of optical noise on the measurement of the contrast ratio. Another improvement for some embodiments of the present invention over the optical wedge mode sensor of Krneta et al '571 is active mode control by using a side-lock technique which provides superior control over the laser mode when compared to the Krneta et al '571 technique of monitoring until the contrast ratio/fringe visibility drops below a threshold. For example, if the ECLD becomes multi-mode due to a thermal or aging shift, the actuator may not have sufficient time to counter the change unless the algorithm actively monitors and corrects for such changes.

FIG. 11 is a schematic illustration of an embodiment of a beam-shearing mode sensor system using an optical wedge, and which is generally indicated as 1100. As shown in FIG. 11 for mode sensor system 1100, input beam 1104 (from the ECLD) is incident upon beamsplitter 1108. A portion of input beam 1104, as indicated by 1110, passes through beamsplitter 1108 to provide a throughput beam, while another portion of input beam 1104, as indicated by 1112 (referred to hereafter as "incident beam" 1112), is reflected from front or first surface 1116 of beamsplitter 1108 toward optical wedge 1120 (see Krneta et al '571) comprising a substantial thickness of an optically transmissive material such as glass. (Alternatively, optical wedge 1120 may be replaced with a non-parallel etalon (NPE).) Beamsplitter 1108 has an antireflection coating (AR) on the back or second surface 1124 of beamsplitter 1108 to suppress multiple reflections towards wedge 1120. AR coating 1124 may be chosen to substantially reduce the power reflected from second surface 1124 relative to the power reflected from first surface 1116. Input beam 1104 may be incident upon beamsplitter 1108 over a range of angles relative to the normal, such as in the range of from about 5 to about 85 degrees. A nominal angle of incidence (AOI) may be about 45 degrees. The reflected beam 1112 may be incident near normal to wedge 1120, as indicated at 1128, and may have AOI's of up to about 35 degrees from the normal. Optimal performance may be obtained when the AOI to wedge 1120 is about 5 degrees or less (for example, from 0 to about 2 degrees) from the normal. As shown in FIG. 11, mode sensor system 1100 uses a near 45 degree angle to beamsplitter 1108. By proper orientation of the elements of mode sensor system 1100 relative to each other, or by rotation of the entire assembly (e.g., beam splitter 1108, optical wedge 1120 and detector 1144) of mode sensor system 1100, the return reflections from wedge 1120, of two adjacent ones are indicated as 1132-1 (reflected by first or front reflection surface 1136 of optical wedge 1120) and 1132-2 (reflected by second or back/rear reflection surface 1140 of optical wedge 1120 from a portion of beam 1112, indicated as 1142, which passes through first surface 1136), may be misaligned from the direction of input beam 1104, thus minimizing optical feedback to the laser light source.

First reflection surface 1136 and second reflection surface 1140 of optical wedge 1120 may be coated (e.g., partially reflective coatings, such as, for example, a multi-layer $TiO_2$/$SiO_2$ coating deposited by ion beam sputtering, or other deposition techniques which are known to the optical component industry) or uncoated, but the reflection coefficients from surfaces 1136 and 1140 should be substantially similar, and within about 50% of each other. Surfaces 1136 and 1140 of wedge 1120 may be made with a small angle (for example, from about 0.011 to about 0.015 degrees) between them. The small angle between reflection surfaces 1136 and 1140 creates a linearly-dependent optical path length difference in the reflections from each surface. Reflected light 1132-1 and 1132-2 may pass back through beamsplitter 1108, thus allowing a substantial portion of the reflected light to be detected by a linear array or a two-dimensional array of photosensitive detectors such as CMOS detectors, CCD detector, photodiodes, etc., which is generally indicated as 1144. Mode sensor system 1100 also includes a common mounting bracket, indicated generally as 1148, for mounting the various components of mode sensor system 1100, including beam splitter 1108, optical wedge 1120, and detector 1144.

At detector 1144, reflections 1132-1 and 1132-2 from optical wedge 1120 interfere with each other to produce a fringe pattern whose spatial wavelength is proportional to the angle between reflection surfaces 1136 and 1140 of wedge 1120. For a near-normal AOI to the wedge, the fringe wavelength is given by the following equation (3):

$$WL_{fringe} = WL_{light}/(2 \times n \times \tan(\theta)) \qquad (3)$$

wherein:
$WL_{fringe}$=the fringe spatial wavelength at the detector plane
$WL_{light}$=wavelength of the light, in a vacuum
n=the index of refraction of the wedge material
θ=the spatial angle between the surfaces of the wedge For a single wavelength of light, such as produced by a stable ECL/ECLD with a single longitudinal mode, these fringes may be characterized as having a large contrast ratio/fringe visibility of the fringe maxima (Max) to the fringe minima (Min). See Krneta et al '571. By definition, the contrast ratio/fringe visibility equals (Max−Min)/(Max+Min). If multiple wavelengths of light are present, the additional wavelengths may generate additional fringe patterns at detector 1144 which can reduce the contrast ratio/fringe visibility. In an ECL/ECLD, additional wavelengths may occur when the ECL/ECLD is operating in multiple longitudinal modes in the laser cavity, or in modes in some other cavity in the ECL/ECLD system. Hence, the contrast ratio of the fringes from this mode sensor may be a sensitive measure of the spectral coherence of the ECL/ECLD.

The spectral separation of the additional laser modes may determine the required thickness of optical wedge 1120. Multi-mode spectral characteristics may depend upon the particular ECL/ECLD. An especially effective model is to understand a common situation in which the ECL/ECLD operates in two cavity modes in the system. Assume that the ECL/ECLD is operating partially in mode 1 and mode 2 with wavelengths $WL_1$ and $WL_2$ which are separated by the free spectral range of the ECL's/ECLD's laser cavity. The two fringe patterns generated by the mode sensor may be out of phase by exactly one-half of one spatial wavelength when the wedge thickness D is given by the following equation (4):

$$D = (m+1)/(4 \times n) \times WL_1 \times WL_2/(WL_2 - WL_1) \qquad (4)$$

wherein m=0, 1, 2, etc.

This thickness of optical wedge 1120, nominally at the center of optical beam 1112, insures that the fringes produced by the side-mode produce the maximum reduction in contrast ratio/fringe visibility. The amount of reduction depends upon the power in the side-mode relative to the primary mode. The thickness of wedge 1120 therefore may have several "optimal" values (i.e., thickness values producing maximum reduction in contrast ratio/fringe visibility, as defined by, for example, a simple model of two laser cavity modes, wherein the optimal thickness insures that the two fringe patterns produced by each cavity mode are shifted by exactly one-half of one spatial wavelength at the detector plane at or near detector 1144) which meet the criteria for a given laser cavity mode spacing. The thickness relationship does not account for the effect of the decoherence of reflections 1132-1 and 1132-2 from one another if wedge 1120 thickness exceeds the coherence length of the laser light source. In this latter scenario, the fringe contrast decreases not because of side modes, but because the coherence length of a single mode is comparable to, or less than, the length defined by twice the thickness of wedge 1120, multiplied by the optical index of refraction of the wedge material.

In certain embodiments of the present invention, a more detailed analysis may be performed on the effect of multiple laser modes on the coherence length of the laser. Such an analysis is disclosed in Tanaka et al., "Littrow-Type External-Cavity Blue Laser for Holographic Data Storage", *Applied Optics,* 46:3583 (2007), the entire disclosure and contents of which is hereby incorporated by reference. The analysis disclosed in Tanaka et al. may be used to refine the optical wedge design for particular laser cavities for which the multi-mode character is understood. The laser cavity need not be a Littrow-type external laser cavity, just as the mode sensor of certain embodiments of the present invention may be applied broadly to lasers of many types.

Embodiments of the present invention emphasize that reflections 1132-1 and 1132-2 from optical wedge 1120 should overlap substantially because this greatly suppresses the effects of variations in the relative optical phase across the beam incident upon detector 1144. Nominally, the overlap of reflections 1132-1 and 1132-2 in a shearing interferometer may be controlled by the AOI to wedge 1120 and the thickness of wedge 1120. As discussed above, the wedge thickness may be constrained to meet the requirements of sensitivity to side modes. Therefore, a method of insuring overlap is to insure that beam 1112 incident on wedge 1120 is incident with an AOI substantially near 0 degrees (but which may deviate from 0 degrees depending upon the amount and type of wavefront errors in beam 1112).

For the purposes of illustrating the use of beam-shearing mode sensor system 1100, the performance of two different variations of such a mode sensor system, one with a 35 degree AOI (incident to optical wedge 1120) and an approximately 4 mm thick optical wedge 1120, and another with the same optical wedge 1120 but with a near 0 degree AOI is evaluated. These two variations of mode sensor system 1100, indicated respectively as 1200 (35 degree AOI) and 1300 (0 degree AOI), are shown in FIGS. 12 and 13. Also shown in FIG. 12 are input beam 1204, incident beam 1212, optical wedge 1220, reflections 1232-1 and 1232-2, first (front) surface 1236 of wedge 1220, second (back) surface 1240 of wedge 1220, and detector 1244 for variation 1200, while FIG. 13 shows input beam 1304, beamsplitter 1308, incident beam 1312, first (front) surface 1316 of beamsplitter 1308, second (back) surface 1324 of beamsplitter 1308, optical wedge 1320, reflections which overlap and are referred to collectively as 1332, first (front) surface 1336 of wedge 1320, second (back) surface 1340 of wedge 1320, portion 1342 of beam portion 1312 passing through first surface 1336, and detector 1344 for variation 1300.

Figure 14:
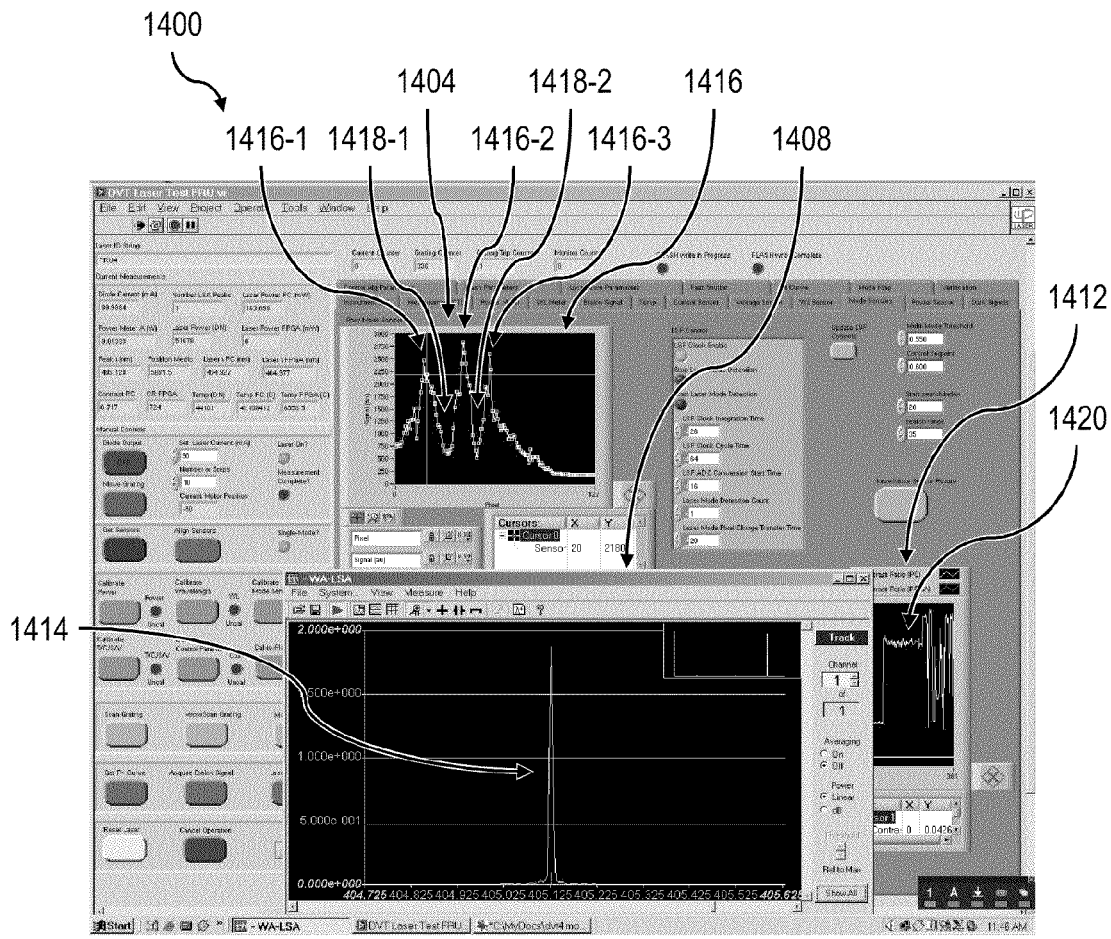
FIG. 14 represents a screen capture of the performance of the 35 degree angle of incidence mode sensor variation shown in FIG. 11.
Figure 15:
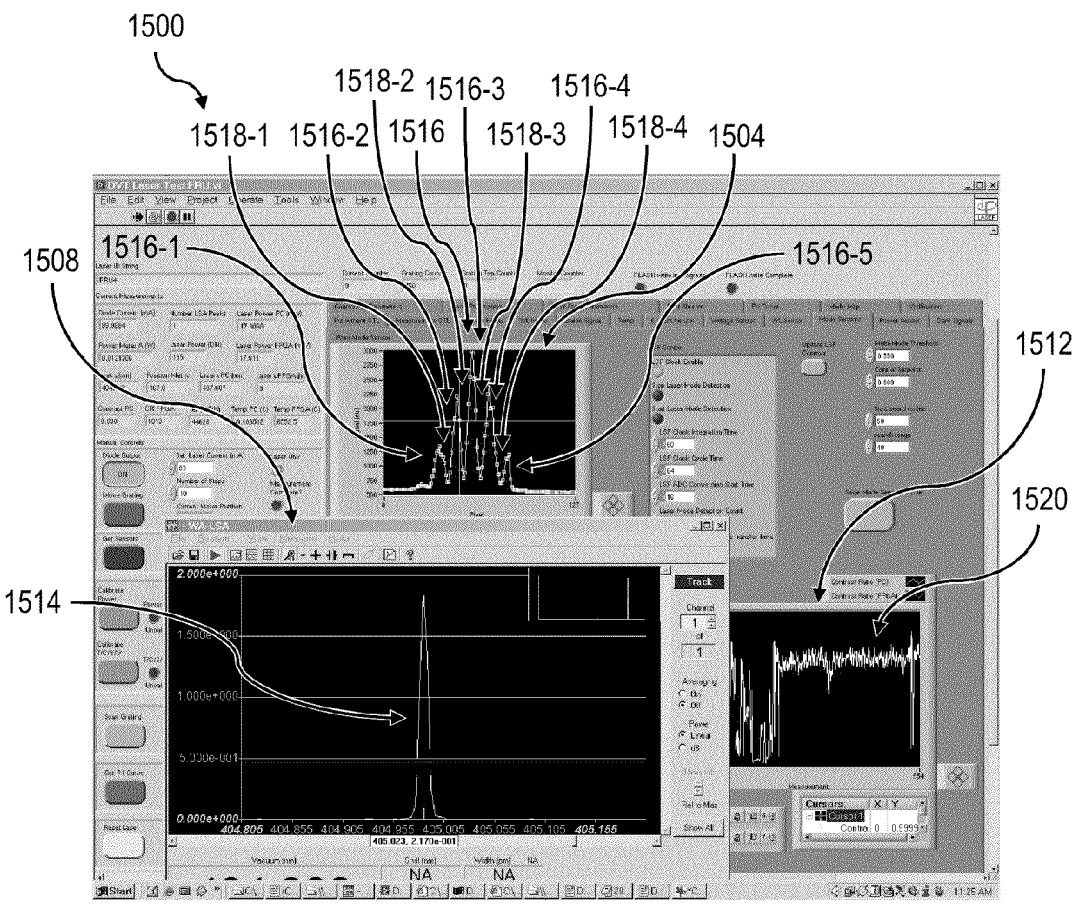
FIG. 15 represents a similar screen capture to that of FIG. 14, but of the performance of the 0 degree angle of incidence mode sensor variation shown in FIG. 13.

The respective resulting fringe patterns, for a single mode laser, are shown in FIGS. 14 and 15 by respective screen captures indicated as 1400 and 1500. For variation 1200 in FIG. 12, thick optical wedge 1220, combined with the larger 35 degree AOI of incident beam 1212 relative to wedge 1220, separates reflections 1232-1 and 1232-2, and causes these reflections 1232-1 and 1232-2 to overlap at the edges of these reflected beams. As a result, variation 1200 with the larger 35 degree AOI produces fewer fringes with inconsistent fringe spacings, as illustrated by screen capture 1400 in FIG. 14, particularly display panels 1404, 1408, and 1412). Panel 1408 is a graph from an optical spectrum analyzer with 1 picometer wavelength resolution. The single peak 1414 on panel 1408 shows that the ECL/ECLD is operating in a single mode state.

Nonetheless, the variation 1200 produces a poor fringe signal from detector 1244, which is shown in and displayed by panel 1404. The fringe pattern 1416 formed in panel 1404 has three peaks 1416-1, 1416-2, and 1416-3. Fringe pattern 1416 also shows two barely complete fringes, indicated as 1418-1 and 1418-2, between respective peaks 1416-1/1416-2 and 1416-2/1416-3, which makes the measured spacing between these peaks 1416-1/1416-2 and 1416-2/1416-3 unequal. Furthermore, small transient jumps (i.e., at the top of peaks 1416-1, 1416-2 and 1416-3) in the signal from hotspots in the interference pattern at detector 1244 create noise in the fringe on panel 1404, adding noise to the measurement of the signal maximum and minimum—and hence making the contrast ratio/fringe visibility measurement less accurate. Panel 1412 shows a chart recording of the contrast ratio/fringe visibility measurements of repeated measurements of the fringes captured in panel 1404. The noise in the fringes of fringe pattern 1416 cause a large variation in the contrast ratio/fringe visibility reported at the end of chart recording 1420 of panel 1412. In a worst case scenario of wavefront errors in the incident beam 1212 which are comparable to, but opposite in sign from, the relative optical phase difference created by wedge 1220, these fringes may be eliminated altogether by the phase shifts in beam 1212.

By contrast, variation 1300 in FIG. 13 with a 0 degree AOI produces, as shown by screen capture 1500 in FIG. 15, and particularly display panels 1504, 1508 and 1512, more symmetric fringe patterns with a more numerous number of complete fringes which show regular fringe spacings which are readily analyzed to determine contrast ratio/fringe visibility. The single peak 1514 in panel 1508 again verifies that the ECL/ECLD is operating in a single mode state. Panel 1504 shows the signal from detector 1344. The fringe pattern 1516 in panel 1504 has five peaks 1516-1, 1516-2, 1516-3, 1516-4, and 1516-5. Fringe pattern 1516 also shows four complete fringe wavelengths, indicated as 1518-1, 1518-2, 1518-3, and 1518-4, between respective peaks 1516-1/1516-2, 1516-2/1516-3, 1516-3/1516-4, and 1516-4/1516-5 under a symmetric amplitude envelope. In addition, no transient signals (jumps) are evident in peaks 1516-1 through 1516-5 of fringe pattern 1516 in panel 1504. The symmetry and lack of noise in fringe pattern 1516 leads to consistent measurements of the fringe maximum and minimum values, thus creating consistent and repeatable measurements of contrast ratio/fringe visibility, as shown in chart 1520 of panel 1512.

A comparison of the data (see panels 1404 and 1408 of screen capture 1400 in FIG. 14) from variation 1200 of FIG. 12 (35 degree AOI to optical wedge 1220), with the data (see panels 1504 and 1508 of screen capture 1500 in FIG. 15) from variation 1300 of FIG. 13 (0 degree AOI to optical wedge 1320), clearly show that the 0 degree AOI of variation 1300 produces superior fringes in the fringe pattern, as well as more consistent and repeatable contrast ratio/fringe visibility measurements. More generally, a 0 degree AOI provides consistent contrast ratio/fringe visibility measurements (see panel 1504 from FIG. 15) which are least sensitive to wavefront errors in incident beam 1112 to detector 1144. The angle tolerance—how close the AOI must be to 0—may be dictated by the magnitude of the wavefront errors in incident beam 1112 and the thickness of the optical wedge 1120. The spatial extent of incident beam 1112 may also be relevant in dictating the AOI tolerance. For example, a smaller incident beam 1112 with a high AOI may experience a larger shearing and separation of the reflected beams (e.g., 1132-1 and 1132-2) compared with the beam diameter of incident beam 1112. A smaller incident beam 1112 diameter, combined with a larger spatial separation, may reduce the reflected beam (e.g., reflections 1132-1 and 1132-2) overlap at detector 1144, and thus reduce the number of interference fringes visible on detector 1144.

Figure 19:
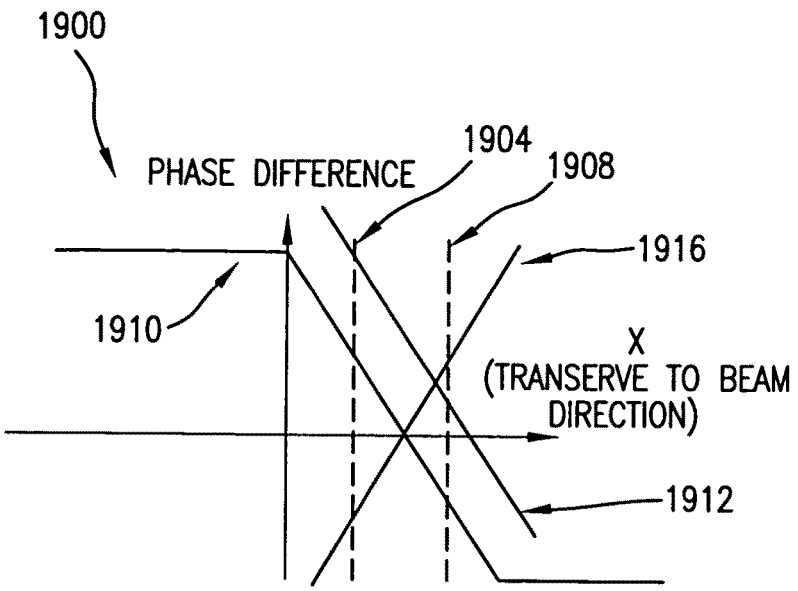
FIG. 19 represents a schematic illustration of the difference in phase between the two beams illustrated in FIG. 18.
Figure 16:
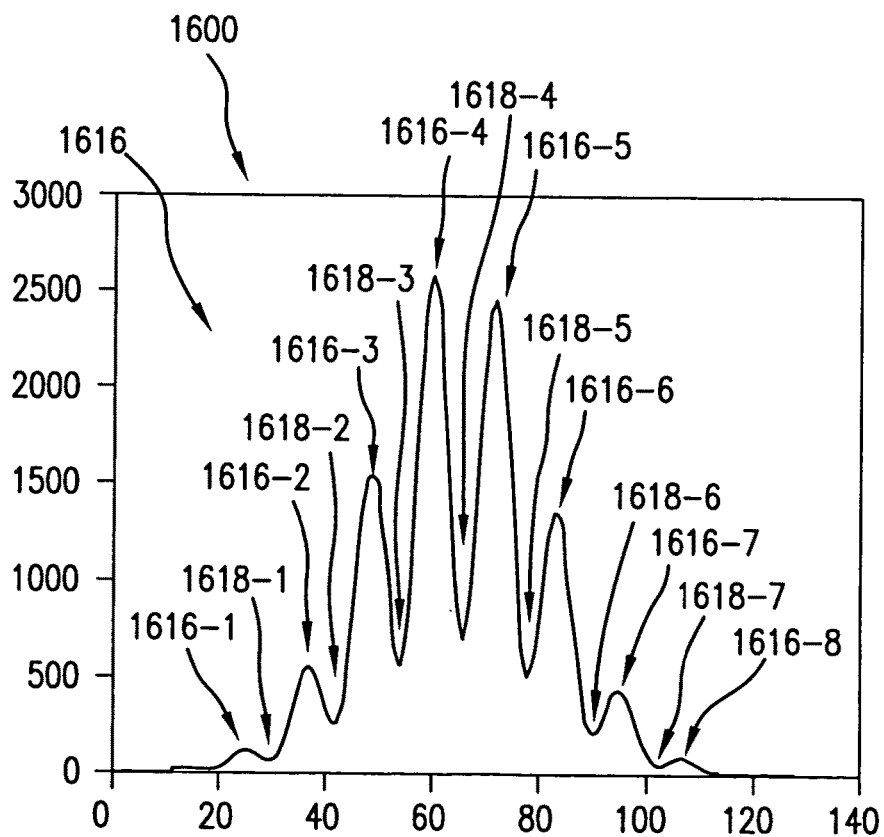
FIG. 16 is a graph representing an analytical model of mode sensor fringes on a Gaussian beam of the mode sensor of FIG. 10.
Figure 17:
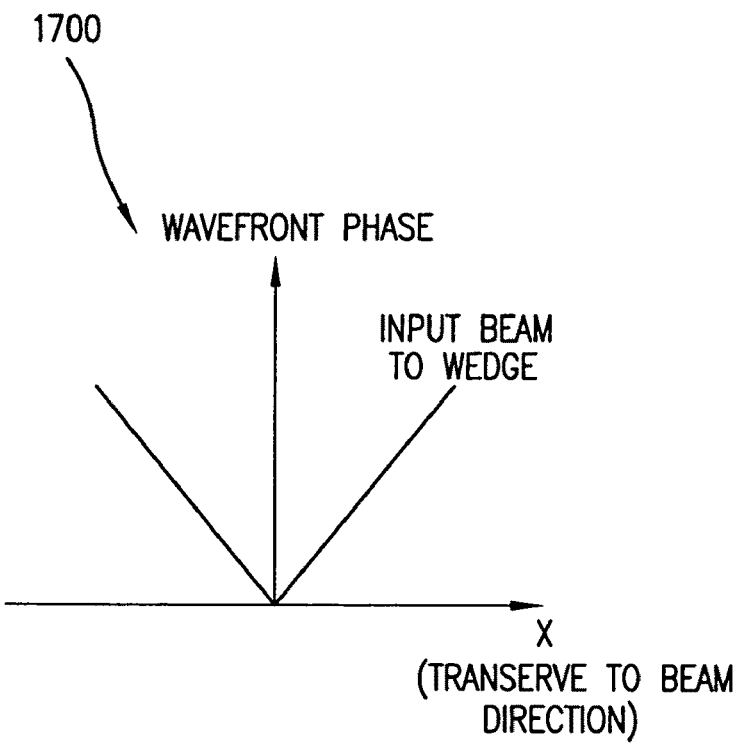
FIG. 17 represents a schematic illustration of a beam incident to the mode sensor of FIG. 11 with a linear phase gradient from the center of the beam.
Figure 18:
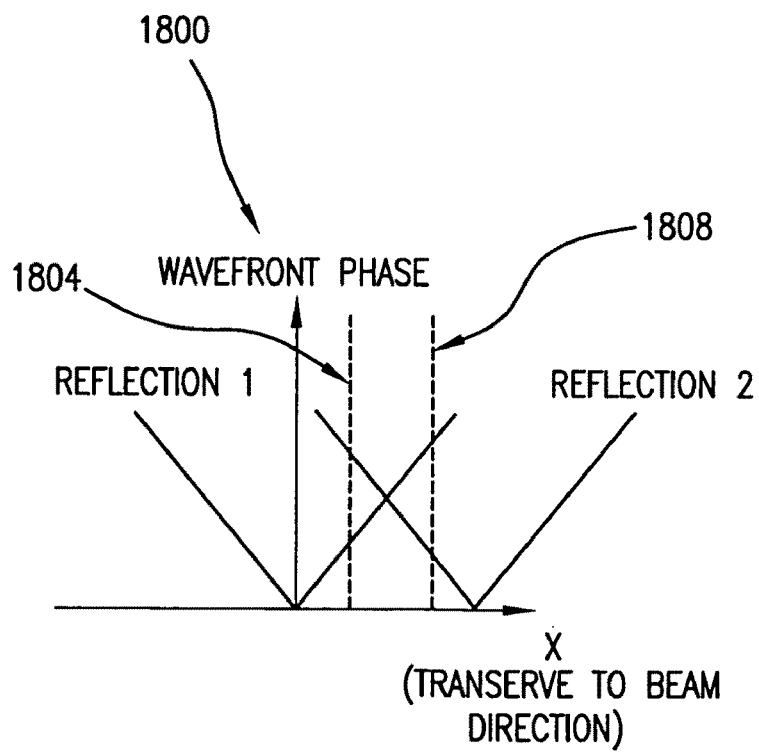
FIG. 18 represents a schematic illustration of a wavefront phase profile for two beams reflected from parallel surfaces, with beam separation of the mode sensor of FIG. 12.

The importance of the spatial wavefront flatness may be understood by considering an analytical model of mode sensor fringes on a Gaussian beam of the mode sensor of FIG. 11, which is represented by graph 1600 of FIG. 16 (with the x-axis representing pixels on the sensor and the y-axis the signal generated by each pixel using an arbitrary scale), in combination with the schematic illustrations shown in FIGS. 17-19: Referring to FIG. 16, graph 1600 represents a fringe pattern 1616 having eight peaks (1616-1 through 1616-8) with seven fringes (1618-1 through 1618-7) between respective adjacent peaks. The fringe pattern data from panel 1504 of FIG. 15 and the graph 1600 in FIG. 16 show interference fringes (1518-1 through 1518-4 and 1618-1 through 1618-7) when the optical beam incident upon optical wedge 1320 has very flat wavefront across incident beam 1312 (i.e., very small relative changes in the optical phase between any two points across the beam). Each fringe 1518-1 through 1518-4 in panel 1504 produced by optical wedge 1320, as well as 1518-1 through 1518-7 in graph 1600 of FIG. 16, represents a phase change of one wave across the optical beam formed by the overlap of the reflections from the first and second surfaces of the optical wedge (for example, beams 1132-1 and 1132-2 in FIG. 11 and collective beams 1332 in FIG. 13).

In contrast to the case of a flat relative optical phase across incident beam 1312 to optical wedge 1320 is the relative optical phase of schematic illustration 1700 shown in FIG. 17. Schematic illustration 1700 in FIG. 17 shows the relative optical phase across an incident beam that is input into the optical wedge (such as incident beams 1112 and 1312 in FIGS. 11 and 13, respectively), wherein a zero relative optical phase is defined at the center of the incident beam and the relative optical phase increases linearly with distance shown the center of the incident beam. When the incident beam to the optical wedge is split and reflected into two interfering beams (for example, beams 1132-1 and 1132-1 in FIG. 11 and collective beams 1332 in FIG. 13), the interfering beams overlap without transverse displacement in the centers of the split beams and the phase difference between the wavefronts of the split or reflected beams may be, at most, a constant across the beam formed by the overlap between the reflected beams (such as, for example, collective beam 1332 in FIG. 13), and only the phase gradient introduced by the optical wedge determines the interference pattern.

However, when the beams reflected from the first and second surfaces 1136 and 1140 of optical wedge 1120 are separated (see schematic illustration 1800 in FIG. 18), the spatial wavefront variations add in the overlap region. (The overlap region is indicated by the dashed vertical lines 1804 and 1808 in FIG. 18). Each beam 1132-1 and 1132-2 reflected from optical wedge 1120 (see FIG. 11), referred to in schematic illustration 1800 in FIG. 18 as Reflections 1 and 2, has a linear gradient in the relative optical phase, with a zero relative optical phase centered at the middle of each of Reflections 1 and 2. The two V-shaped patterns shown in schematic illustration 1800 do not overlap because Reflections 1 and 2 are spatially separated. Therefore, in the overlap region 1804/1808 between Reflections 1 and 2, the linear phase gradient of slope m of Reflection 1, minus the linear optical phase gradient of slope negative m of Reflection 2, produces a difference in optical phase between Reflections 1 and 2 which has a slope of 2×m. This case is further illustrated in schematic illustration 1900 of FIG. 19 (the overlap region now being indicated by the dashed vertical lines 1904 and 1908). The phase across the beam (i.e., the overlap 1904/1908 between Reflections 1 and 2) may be represented by the sum $\phi|$wedge$(x)+\phi|$beam$1(x)-\phi|$beam$2(x)$, wherein x is the coordinate (see x-axis in schematic illustration 1800 of FIG. 18) transverse to the propagation direction of Reflections 1 and 2 (for example, see reflections 1232-1 and 1232-2 in FIG. 12), $\phi|$wedge$(x)$ is the relative phase difference between Reflections 1 and 2 due to the optical edge, $\phi|$beam$1(x)$ is the optical phase profile across the beam of Reflection 1 and $\phi|$beam$2(x)$ is the optical phase profile across the beam of Reflection 2.

In schematic illustration 1900 of FIG. 19, the phase variation in overlap region 1904/1908 is twice the slope of the phase change in the wavefront. (The relative difference between the optical phase of Reflections 1 and 2 of schematic illustration 1800 of FIG. 18 is indicated by line 1910 in schematic illustration 1900 of FIG. 19.) If the gradient in the relative optical phase between Reflections 1 and 2 is the same sign as the phase gradient produced by the optical wedge (indicated in schematic illustration 1900 by line 1912), then the optical phase gradients will add together. If the gradients add together, then the interference fringes will occur with half the spatial wavelength and may not be resolvable on detector 1144 due to finite pixel size of the detector. Conversely, the gradient from the difference between Reflections 1 and 2 may subtract from the wedge gradient (indicated by line 1916 in FIG. 19) if the optical wedge is oriented in the opposite direction. In this second case, the interference between Reflections 1 and 2 will produce no fringes because there will not be any spatially-varying optical phase in overlap region 1904/1908. By extension, nonlinear optical phase changes across Reflections 1 or 2 may produce more complicated changes to the expected linear phase gradient across the interference beam.

Measurement of the contrast ratio may be performed in a number of ways. A simple approach may be to measure the largest fringe and the size of the adjacent minimum fringe (hereafter referred to as "the Max/Min Method"). See Krneta et al '571. However, this approach may be sensitive to intensity spikes which may occur due to imperfections in the beam intensity profile (see panel 1404 in FIG. 14, which shows fringe pattern 1416 with small transient spikes on top of the fringe maxima of peaks 1416-1, 1416-2, and 1416-3). Embodiments of the present invention may use a Fast Fourier Transform (FFT) of the fringe signal to discriminate the amplitudes of the fringes from the DC components due to offsets, as well as higher spatial frequency features such as spikes which cover just a few pixels. Analytically, for a signal comprising a sinusoidal fringe pattern with a Gaussian envelope (see simulated graph 1600 in FIG. 16), the contrast ratio/fringe visibility may be shown as being equal to the ratio of the Fourier component due to the fringe sinusoid and the Fourier component due to the zero frequency component.

Figure 20:
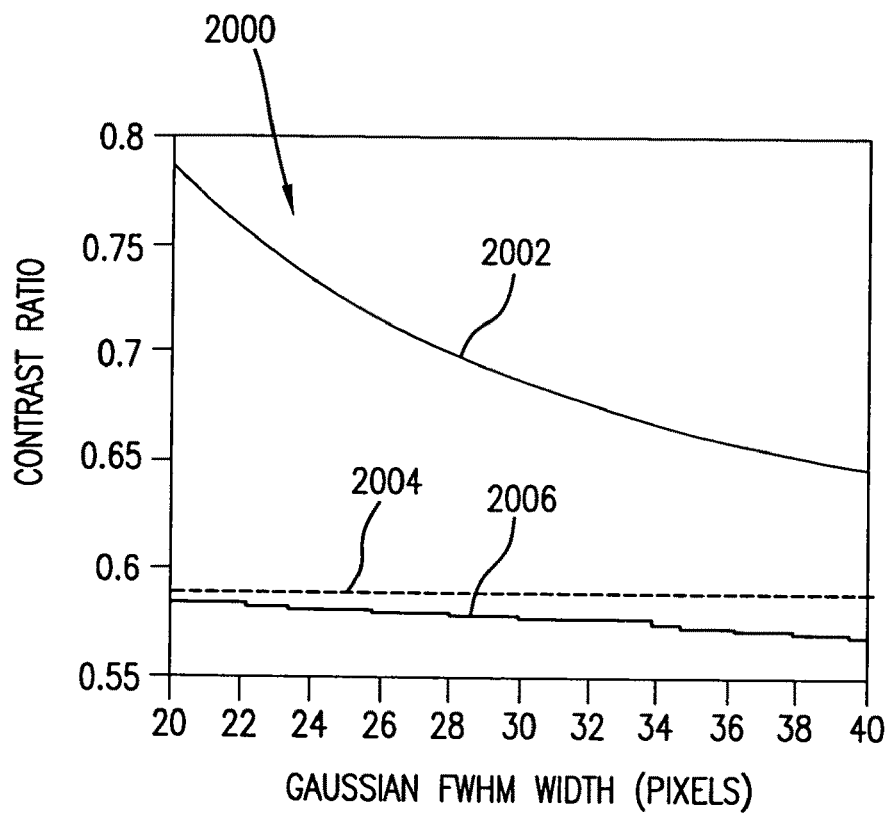
FIG. 20 is a graph of the contrast ratio versus Gaussian full-width half maximum (FWHM) showing the effect of changing the width (x-axis) of the Gaussian amplitude envelope when the fringe wavelength remains fixed.

When the Max/Min Method is compared with the FFT method, the results of the FFT method may show smaller variations in the calculated contrast ratio/fringe visibility than the Max/Min Method. The calculated contrast ratio/fringe visibility max change due to changes in the location of the fringe pattern 1616 in FIG. 16, relative to the location of the peak of the Gaussian amplitude envelope, is shown in graphical plot 2000 of FIG. 20. Graphical plot 2000 in FIG. 20 shows the effect of changing the width (x-axis of plot 2000) of the Gaussian amplitude envelope when the fringe wavelength remains fixed. Line 2002 represents the results of the Min/Max Method calculation of contrast ratio/fringe visibility. Line 2004 represents the theoretical value of the true contrast ratio/fringe visibility. Line 2006 represents the contrast ratio/fringe visibility as calculated by the FFT Method. As shown in plot 2000, the FFT Method (line 2006) has much smaller variations in contrast ratio/fringe visibility than the Max/Min Method (line 2002). The FFT method also produces values which are much closer to the theoretical value (line 2004), as shown by the closer proximity of line 2006 to line 2004 compared to line 2002 to line 2004.

Figure 21:
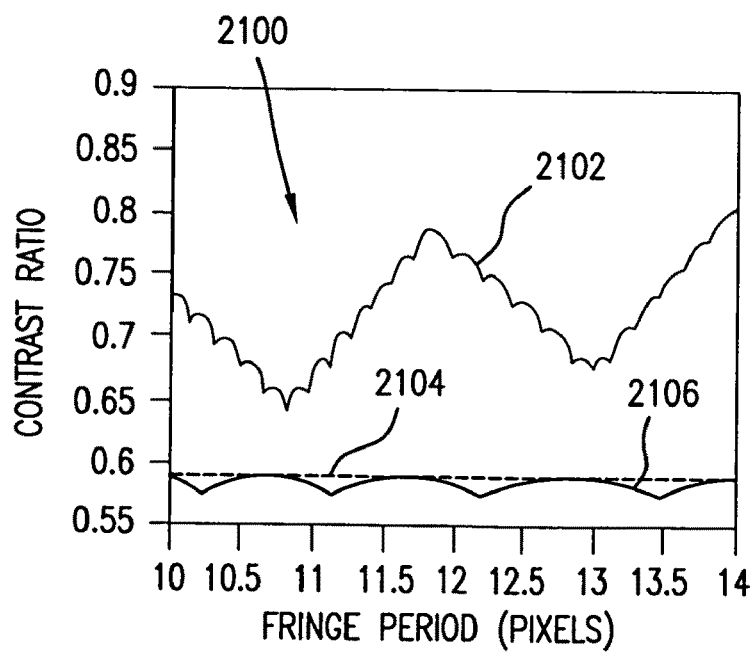
FIG. 21 is a similar graph to that of FIG. 20 of the contrast ratio versus Gaussian FWHM of 20 pixels showing changes due to increases (or decreases) in the fringe wavelength or period (x-axis) of the interference fringes.
Figure 22:
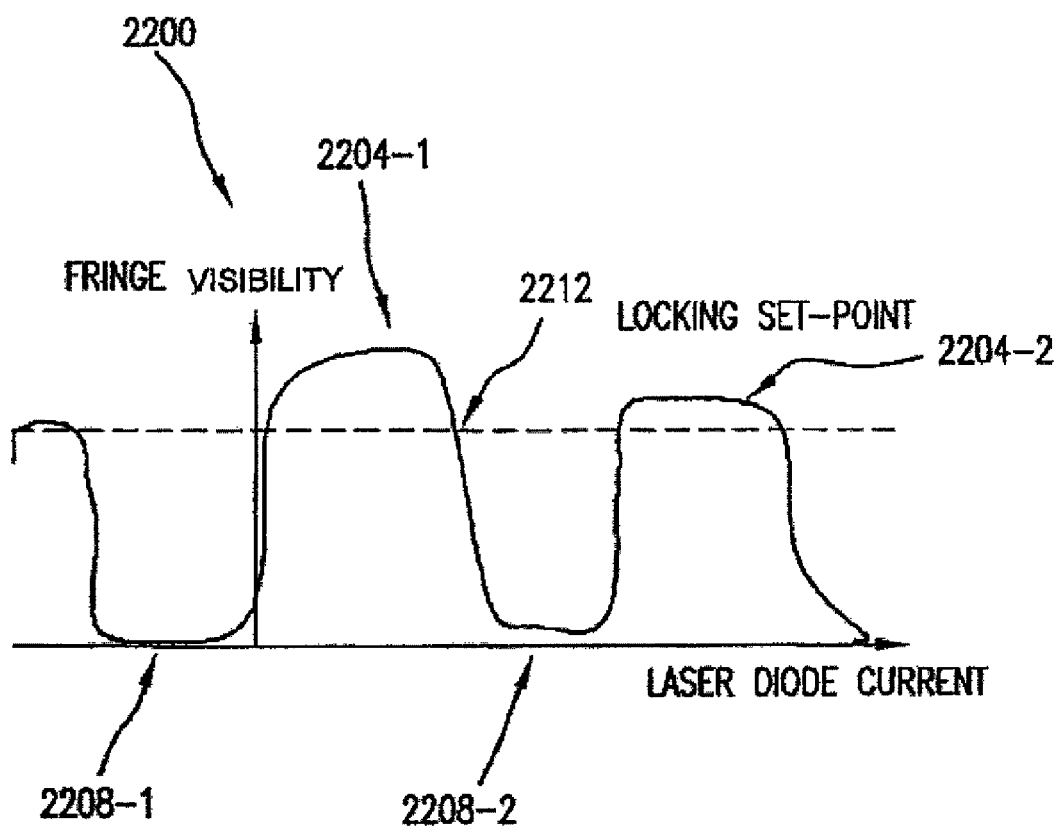
FIG. 22 represents a plot of contrast ratio/fringe visibility reported by a mode sensor versus laser diode current.

Even if the Gaussian envelope has a fixed width, and as shown by graphical plot 2100 in FIG. 21, the measured contrast ratio/fringe visibility may change due to increases (or decreases) in the fringe wavelength or period (x-axis of plot 2100) of the interference fringes. Line 2102 represents the results of the Max/Min Method, line 2104 represents the actual contrast ratio/fringe visibility value, and line 2106 represents the results of the FFT Method. Once again, the FFT calculated contrast ratio/fringe visibility (line 2106) varies less and is closer to the true value of contrast ratio/fringe visibility (line 2104), than the Max/Min Method (line 2102).

The contrast ratio/fringe visibility from the mode sensor may be used to actively feedback via an analog servo control circuit or digital signal processor to a laser cavity control parameter such as laser/laser diode current, laser cavity temperature, grating angle relative to the output of the laser diode, etc. Often, the ECL/ECLD remains in a single mode state over large regions of the control parameter space. The control space may be represented according to plot 2200 in FIG. 22. In this example plot 2200, the laser diode current (the horizontal axis of plot 2200) is the control parameter for the contrast ratio/fringe visibility (the vertical axis of plot 2200). As the laser diode current is changed, the contrast ratio/fringe visibility will show a series of plateaus (indicated as 2204-1 and 2204-2) of elevated value, separated by canyons or valleys of multi-mode behavior (indicated as 2208-1 and 2208-2).

Embodiments of the present invention may use the rapid change in the contrast ratio/fringe visibility at the edge of the plateaus for active feedback to maintain the ECL/ECLD in a single-longitudinal mode state. The difference between the measured contrast ratio/fringe visibility and a locking setpoint or target value for the contrast ratio/fringe visibility (indicated as 2212 in FIG. 22) is then used to calculate a correction to the laser cavity control parameter. For example, it may be desired to control the laser/laser diode to maintain a contrast ratio/fringe visibility of 0.9, but instead a value of 0.6 is measured by the mode sensor. A circuit or signal processor may take the difference between the measured and target contrast ratio/fringe visibility, 0.3 in this example, and calculate a correction to one of the laser cavity control variables, such as laser/laser diode current, to reduce this difference. The correction calculation may be performed using standard techniques of servo control theory, such as a Proportional Integral Derivative (PID) loop. The correction may then be applied to the control variable, such as laser/laser diode current, cavity temperature, grating angle, etc. The contrast ratio/fringe visibility may then be remeasured and the process repeated, maintaining the laser cavity in such a condition that the contrast ratio/fringe visibility remains locked to the setpoint.

3. Use of Non-Output Beams from Transmissive Diffraction Grating for Laser Monitoring Another aspect of the present invention is using additional beams created by an ECLD diffraction grating for the purposes of ECLD monitoring, as an output beam from the ECLD, etc. In one such embodiment, the specular reflection R0 beam from a transmissive diffraction grating may be used to monitor the angle of the diffraction grating. In an ECLD, the grating angle determines the wavelength, so the position of the R0 beam may be used as a wavelength sensor by calibrating the position of the R0 beam to an external wavelength meter. For example, the position of the R0 beam relative to an external wavelength meter may be calibrated similar to how the PSD measured position is calibrated relative to an external wavelength meter, as illustrated in FIGS. 8 and 9.

In another embodiment, mirrors may be attached to the transmissive diffraction grating, or to the structural support for the transmissive diffraction grating. These mirrors reflect the R0 or T1 beams created by a transmissive diffraction grating. The R0 or T1 beam may rotate with the transmissive diffraction grating, but upon reflection from a mirror also attached to the grating, the reflected R0 or T1 beam no longer steers with the grating as the grating is rotated. Instead, the reflected R0 or T1 beam is reflected back along a direction at an angle to the beam incident upon the diffraction grating. As the diffraction grating is rotated, reflected beam R0 (or reflected beam T1) translates relative to the same vector direction, but does not change its angle relative to the direction of the beam incident upon the grating. This translation may be relatively small. One benefit of this embodiment of the present invention is that the reflected R0 or T1 beam may be easier to align to laser sensors because the pointing direction of the beams do not change. The reflected beam RO (or reflected beam T1) may be used as additional outputs from the laser. Another benefit of this embodiment of the present invention is that the reflected R0 or T1 beams may be reflected back towards the laser diode source and the electronics which drive the laser diode source, thus enabling a compact optical layout for the ECL/ECLD and shorter cable lengths for sensors which may use these new beams.

The concept of using a turning mirror, attached to the grating structure to prevent beam steering in an ECLD is discussed by Hawthorn et al. in *Review of Scientific Instruments,* 72:4477 (2001) for an ECLD using reflection diffraction gratings, the entire disclosure and contents of which is hereby incorporated by reference. Only two beams are created from a reflection diffraction grating: a specular reflection R0 beam and the beam for the first diffraction order, often called the R1 beam. Previously in ECLs/ECLDs based on reflective diffraction gratings, the R0 beam is the main output beam of the ECLD, so an additional turning mirror would prevent output beam steering. Such prior use of the R0 beam created a main output beam for the ECL/ECLD which did not change its pointing direction, but was not used to create a compact optical configuration or a beneficial placement of sensors with other electronics.

Figure 23:
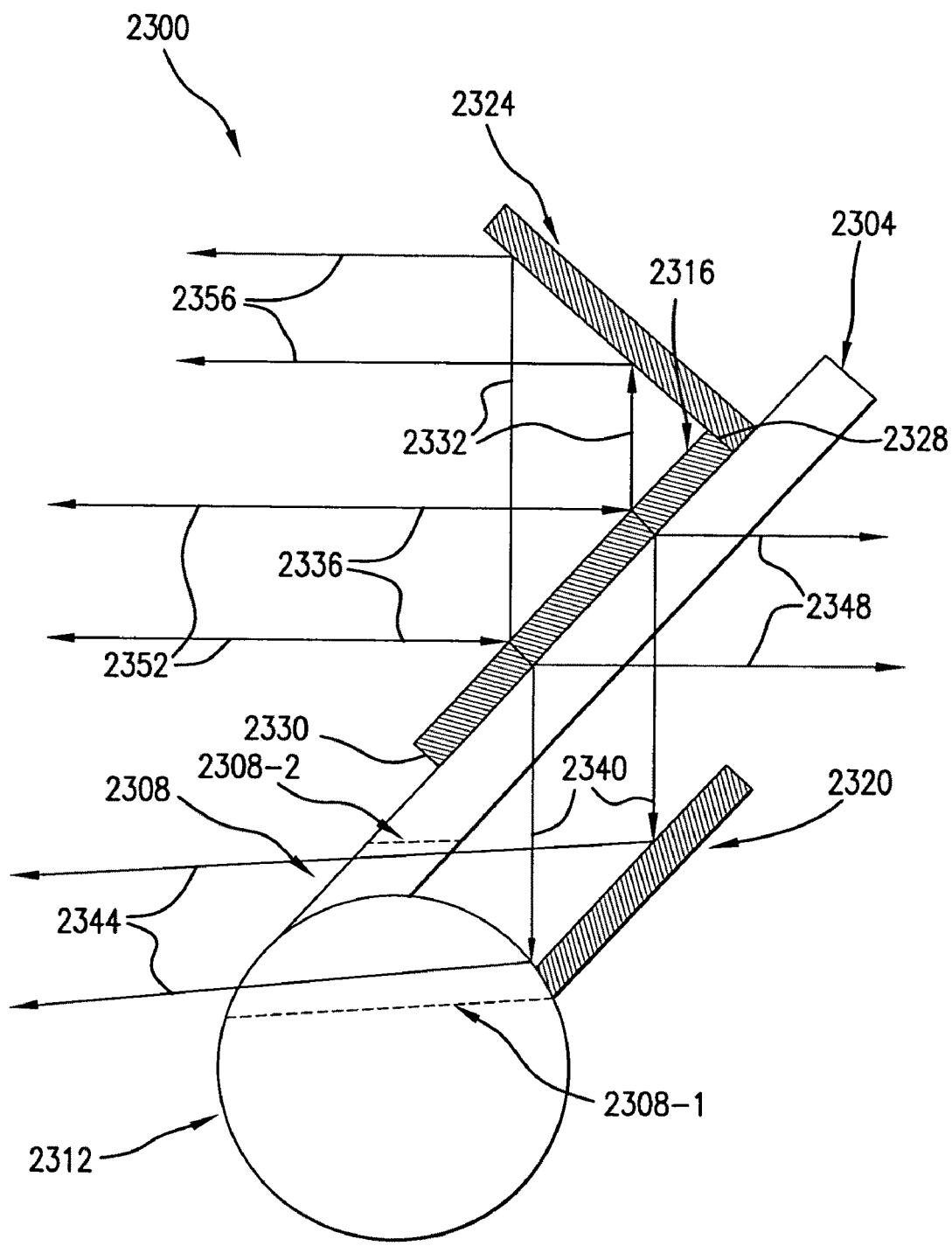
FIG. 23 is a schematic illustration of a device or system for using one or more non-output beams from a transmissive diffraction grating in an ECLD to monitor the laser mode of the laser/laser diode of an ECL/ECLD.

By contrast, in embodiments of the present invention, the additional turning mirrors may prevent beam steering in the multiple, non-output beams from a transmission grating. In one embodiment, a mirror may be attached to the pivot-point mechanism on the output-side of a transmission grating in an ECL/ECLD. Because the mirror rotates with the grating, it reflects the T1 beam back towards the grating mount or frame. This embodiment is illustrated schematically in FIG. 23 as a device or system, indicated generally as 2300. As shown in FIG. 23, device/system 2300 comprises a grating mount or frame 2304 having a beam opening or passage 2308, as indicated by dashed lines 2308-1 and 2308-2, which extends through grating frame 2304. A pivot mechanism, indicated generally as 2312, which is proximate the pivot point for grating frame 2304 is provided for rotating or pivoting grating frame 2304 within an angular range. A transmissive diffraction grating 2316 is mounted on, connected to, attached to, etc. (for example, by an adhesive or by a mechanical fastener such as a clamp or screws) grating frame 2304. Device 2300 also includes a first turning mirror 2320 mounted on, connected to, attached to, etc. a portion of pivot mechanism 2312 and a second turning mirror 2324 which is connected or attached at or proximate to adjacent upper end 2328 of diffraction grating 2316 which is spaced from opposite lower end 2330 of grating 2316, and may be oriented orthogonal relative thereto (and at a fixed angle) so as to collect all of R0 beam 2332 formed by diffraction grating 2316 reflecting a portion of collimated beam 2336 from the laser/laser diode (not shown).

First turning mirror 2320, which is mounted on, connected to, attached to, etc., the pivot mechanism 2312 proximate the pivot point at a fixed angle relative to grating 2316, collects all of T1 beam 2340 which passes through diffraction grating 2316. T1 beam 2340 is directed by diffraction grating 2316 towards first turning mirror 2320, which then reflects the collected T1 beam through opening 2308, thus emerging as reflected T1 beam 2344. Reflected T1 beam 2344 may be used for monitoring the performance of the laser/laser diode (like a beam-shearing mode sensor), a power monitoring photo-diode, an etalon for relative wavelength measurement or laser frequency calibration, a gas cell for absolute wavelength measurement, another output for the laser/laser diode, etc. Also shown in FIG. 23 are T0 beam 2348 (which passes through diffraction grating 2316), diffracted R1 beam 2352 (which is diffracted back from diffraction grating 2316), and a reflected R0 beam 2356 (which is reflected from second turning mirror 2324). Reflected R0 beam 2356 may be used for all of the uses mentioned previously for beam 2344. The opportunity to use either reflected R0 beam 2356 or reflected T1 beam 2344 provides the laser designer or user improved flexibility in how to implement laser monitoring or control optics without the added loss of splitting a portion of the output beam 2348. Alternately, reflected R0 beam 2356 or reflected T1 beam 2344 may provide additional outputs from the laser, for delivery to any of various end-user applications.

By creating a beam passage 2308 in grating frame 2304, the reflected T1 beam 2344 may pass through to an area next to the laser/laser diode and collimation optics. One benefit of this embodiment is that it allows for a very compact optical path for the placement of sensors or other functions by folding of reflected T1 beam 2344 and/or reflected R0 beam 2356 back in the same direction (as R1 beam 2352) from where collimated laser beam 2336 originated (i.e., the R1 beam is reflected by diffraction grating 2316 back towards the laser/laser diode). Another benefit of this embodiment is that it directs reflected T1 beam 2344 and/or reflected R0 beam 2356 towards the electronics which drive the laser/laser diode, thus allowing placement of a sensor for laser monitoring which uses a substantially co-located set of electronics for monitoring the reflected T1 beam 2344/R0 beam 2356, as well as driving the laser/laser diode current.

In a compact ECL/ECLD system, it may be advantageous to drive the laser/laser diode and the sensor/detectors from a common circuit board to save space, minimize parts, maintain integrity of the electronic signals, etc. By returning a monitoring beam, such as R1 beam 2352, back towards the laser/laser diode, the electro-optical circuits of monitoring sensors may be place near the laser/laser diode, thus enabling shorter cable lengths which reduces noise on electronic signals, reduces the cost of cable assemblies, etc. The compact placement may also allow for placing all the electronics on a single board. All of these benefits may be made possible if a monitoring beam (e.g., reflected T1 beam 2344) is directed back towards the laser/laser diode which sources the light for the laser cavity of the ECL/ECLD.

In another embodiment, first turning mirror 2324 may be mounted on, connected to, attached to, etc. grating frame 2304 on the laser cavity-side of diffraction grating 2316. Because first turning mirror 2324 rotates with grating 2316, mirror 2324 reflects R0 beam 2332 back towards the laser/laser diode as reflected beam 2356. One benefit of this other embodiment is that it allows for a very compact optical path for the placement of sensors or other functions. Another benefit of this other embodiment is that it directs a beam towards the electronics that drive the laser/laser diode, thus allowing placement of a sensor for laser monitoring which uses a substantially co-located set of electronics for monitoring collimated beam 2336 (using, for example, reflected R0 beam 2356), and driving the laser diode current, again providing the benefits described above in the one embodiment.

Embodiments of the present invention may be used in or with holographic systems; for example, holographic data storage and retrieval systems that implement holographic optical techniques such as holographic data storage (HDS) drive systems. See, for example, commonly-assigned U.S. Pat. No. 7,397,571 (Krneta et al.), issued Jul. 8, 2008, the entire contents and disclosure of which is hereby incorporated by reference, and especially FIG. 1 which provides a block diagram of an exemplary holographic data storage system with which embodiments of the present invention may be advantageously implemented. It should be appreciated that although embodiments of the present invention will be described in the context of the exemplary holographic system shown in FIG. 1, embodiments of the present invention may also be implemented in connection with any system, now or later developed, which implements a light source, such as a laser diode.

All documents, patents, journal articles and other materials cited in the present application are hereby incorporated by reference.

Although the present invention has been fully described in conjunction with several embodiments thereof with reference to the accompanying drawings, it is to be understood that various changes and modifications may be apparent to those skilled in the art. Such changes and modifications are to be understood as included within the scope of the present invention as defined by the appended claims, unless they depart therefrom.

What is claimed is:

1. A system comprising:
an external cavity laser having a laser cavity comprising:
　a laser medium for generating laser light;
　a movable wavelength tuning element spaced from the laser medium for receiving at least a portion of the laser light; and
　two or more partially reflective optical surfaces which provide feedback of laser light to the laser medium and define the operating mode of the laser cavity;
a positional light source which generates positional light; and
a position sensitive detector which receives at least a portion of the positional light;
wherein the positional light source is connected to the wavelength tuning element so that, as the wavelength tuning element moves, the positional light source moves along a track;
wherein, in receiving the portion of the positional light, the position sensitive detector thereby determines a position of the wavelength tuning element based on movement of the positional light source along the track;

wherein the laser comprises a laser diode;
wherein the wavelength tuning element is a diffraction grating, and wherein the laser cavity is positioned between the laser diode and the diffraction grating;
wherein the diffraction grating pivots about a pivot point within an angular range, and wherein the position sensitive detector thereby determines an angular position of the diffraction grating;
wherein the positional light source is mounted on a positional light source mount, wherein the positional light source mount is connected to a second end of the grating frame spaced from the one end for pivotal movement about the pivot point so that the positional light source travels along a curved track, and wherein the position sensitive detector detects a position of the positional light source along the track.

2. The system of claim 1, wherein the diffraction grating pivots within an angular range of up to about 1 degree.

3. The system of claim 1, wherein the diffraction grating is connected to a grating frame and wherein the grating frame pivots at one end about the pivot point.

4. The system of claim 1, wherein pivotal movement of the grating frame about the pivot point is responsive to movement imparted proximate the second end.

5. The system of claim 4, which further comprises a reciprocating member connected proximate the second end, and wherein the reciprocating member imparts the movement to the second end so that the positional light source travels along a curved track in an arc.

6. The system of claim 5, wherein wavelengths of the laser light are calibrated as a function of the position of the grating frame.

7. The system of claim 1, wherein the diffraction grating comprises a transmissive diffraction grating.

8. The system of claim 1, wherein the diffraction grating is connected to a movable mechanical assembly which moves linearly and laterally back and forth.

9. The system of claim 1, wherein the positional light source is a light emitting diode.

10. The system of claim 1, wherein the diffraction grating comprises a reflective diffraction grating.

11. The system of claim 1, wherein the diffraction grating comprises a transmissive diffraction grating.

12. The system of claim 1, wherein the position sensitive detector is a two-dimensional sensor array or a one-dimensional sensor array.

13. The system of claim 12, wherein the position sensitive detector is a two-dimensional CMOS camera, a two-dimensional CCD, or a quad cell photodiode.

14. The system of claim 12, wherein the position sensitive detector is a CMOS linear array, a CCD linear array, or a bicell photodiode.

15. The system of claim 12, wherein the position sensitive detector is one-dimensional position sensitive detector, and wherein two photocurrents from the one-dimensional position sensitive detector are measured to determine the position of the positional light source.

16. The system of claim 1, wherein wavelengths of the laser light are calibrated as a function of the position of the wavelength tuning element.

17. The system of claim 1, wherein the wavelength tuning element is an etalon.

18. The system of claim 17, wherein the etalon pivots about a pivot point within an angular range, and wherein the position sensitive detector thereby determines an angular position of the etalon.

19. A method comprising the following steps of:
(a) providing an external cavity laser system comprising:
an external cavity laser having a laser cavity comprising:
a laser medium for generating laser light;
a movable wavelength tuning element spaced from the laser medium for receiving at least a portion of the laser light; and
two or more partially reflective optical surfaces which provide feedback of laser light to the laser medium and define the operating mode of the laser cavity;
a positional light source which generates positional light; and
a position sensitive detector which receives at least a portion of the positional light; and
(b) determining a position of the wavelength tuning element based on detection by the position sensitive detector of movement of the positional light source along a track detected;
wherein the positional light source is connected to the wavelength tuning element so that, as the wavelength tuning element moves, the positional light source moves along the track;
wherein the laser comprises a laser diode;
wherein the wavelength tuning element is a diffraction grating, and wherein the laser cavity is positioned between the laser diode and the diffraction grating;
wherein the diffraction grating pivots about a pivot point within an angular range, and wherein the position sensitive detector determines during step (b) an angular position of the diffraction grating;
wherein the positional light source travels along a curved track, and wherein the position sensitive detector detects a position of the positional light source along the track during step (b).

20. The method of claim 19, wherein the position sensitive detector is a two-dimensional sensor array or a one-dimensional sensor array.

21. The method of claim 20, wherein the position sensitive detector is one-dimensional position sensitive detector, and wherein step (b) comprises measuring two photocurrents from the one-dimensional position sensitive detector to determine the position of the positional light source.

22. The method of claim 19, wherein wavelengths of the laser light are calibrated as a function of the position of the wavelength tuning element, and wherein the position of the positional light source determined by the position sensitive detector thereby determines the wavelength of the laser light.

23. The method of claim 19, wherein the wavelength tuning element is an etalon.

24. The method of claim 23, wherein the etalon pivots about a pivot point within an angular range, and wherein the position sensitive detector thereby determines an angular position of the etalon.

* * * * *